United States Patent
Nardi et al.

(10) Patent No.: US 9,000,819 B1
(45) Date of Patent: Apr. 7, 2015

(54) RESISTIVE SWITCHING SCHMITT TRIGGERS AND COMPARATORS

(71) Applicant: Intermolecular Inc., San Jose, CA (US)

(72) Inventors: Federico Nardi, Palo Alto, CA (US); Yun Wang, San Jose, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 14/133,117

(22) Filed: Dec. 18, 2013

(51) Int. Cl.
*H03K 3/00* (2006.01)
*H03K 3/0233* (2006.01)

(52) U.S. Cl.
CPC ........ *H03K 3/02335* (2013.01); *H03K 3/02337* (2013.01)

(58) Field of Classification Search
CPC ................. H03K 3/02335; H03K 3/02337
USPC ......... 327/80, 81, 74, 75, 185, 198, 199, 205, 327/206, 208; 365/8, 46, 100, 158
See application file for complete search history.

(56) References Cited

U.S. PATENT DOCUMENTS 8,116,127 B2 * 2/2012 Cho et al. ...................... 365/163

OTHER PUBLICATIONS

Wu, M., et al.; LowPower and Highly Reliable Multilevel Operation in ZrO2 1T1R RRAM; Aug. 1, 2011; IEEE; IEEE Electron Device Letters vol. 32 No. 8 pp. 1026-1028.
Strukov; Analog CMOSMemristor Hybrid Circuits; Sep. 1, 2011; UC Santa Barbara; Unknown.
Federico Nardi et al.; Resistive Switching by VoltageDriven Ion Migration in Bipolar RRAMPart I Experimnental Study; Sep. 1, 2012; IEEE.

* cited by examiner

*Primary Examiner* — Jung Kim

(57) ABSTRACT

A resistive switching element can be used in a nonvolatile digital Schmitt trigger circuit or a comparator circuit. The Schmitt trigger circuit can include a resistive switching circuit, and a reset circuit. The resistive switching circuit can provide a hysteresis behavior suitable for Schmitt trigger operation. The reset circuit can be operable to reset the resistive switching circuit to a high resistance state. The comparator circuit can include a resistive switching circuit, a reset circuit, and a threshold setting circuit. The resistive switching circuit can include a resistive switching element, and can be operable to provide a signal comparing an input voltage with the set or reset threshold voltage of the resistive switching element. The threshold setting circuit can be operable to modify the set or reset threshold of the resistive switching element, effectively changing the reference voltage for the comparator circuit.

6 Claims, 25 Drawing Sheets

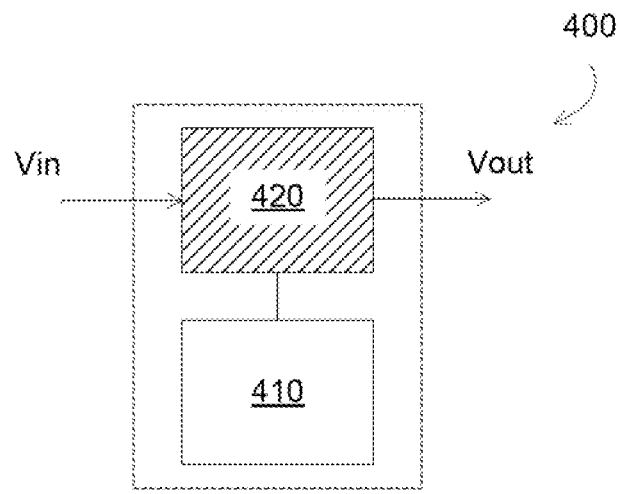
FIG. 4A
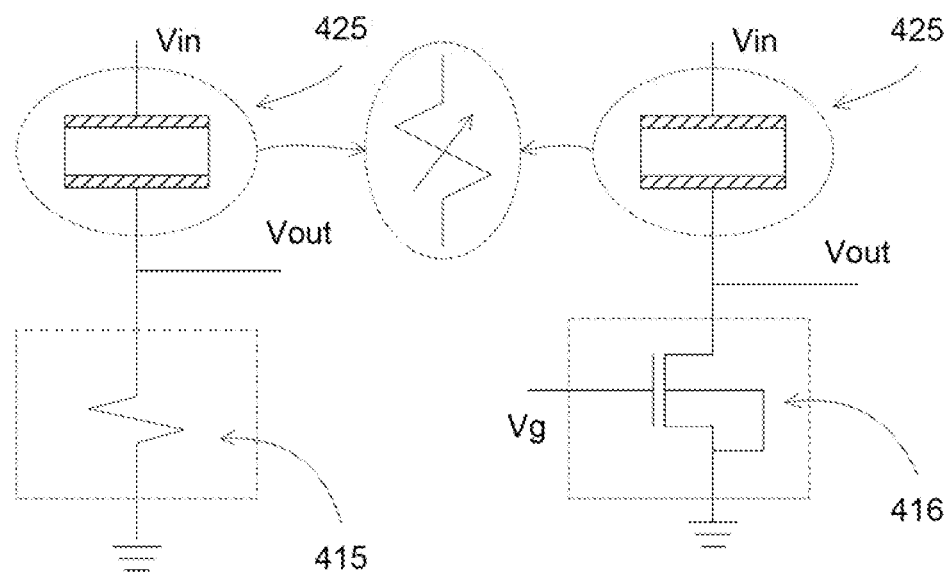
FIG. 4B  FIG. 4C

Incorporating a resistive switching device and a current control device to a nonvolatile Schmitt trigger circuit, wherein the resistive switching device is configured to accept an input voltage, wherein the current control device is configured to generate an output voltage
500

*FIG. 5A*

Providing a circuit having a resistive switching device and a current controlling device
530

Applying an input voltage to the circuit to achieve a Schmitt trigger function, wherein the circuit comprises a transfer function of a resistance – voltage curve
540

*FIG. 5B*

Incorporating a resistive switching circuit, and a converter circuit to form a nonvolatile Schmitt trigger circuit, wherein the nonvolatile Schmitt trigger circuit is operable to accept an input voltage and generate an output voltage having a Schmitt trigger response curve
800

*FIG. 8A*

Providing a circuit having a resistive switching circuit, and a converter circuit
830

↓

Applying an input voltage to the resistive switching circuit
840

↓

Applying a converter voltage to the resistive switching circuit to achieve a Schmitt trigger output voltage
850

*FIG. 8B*

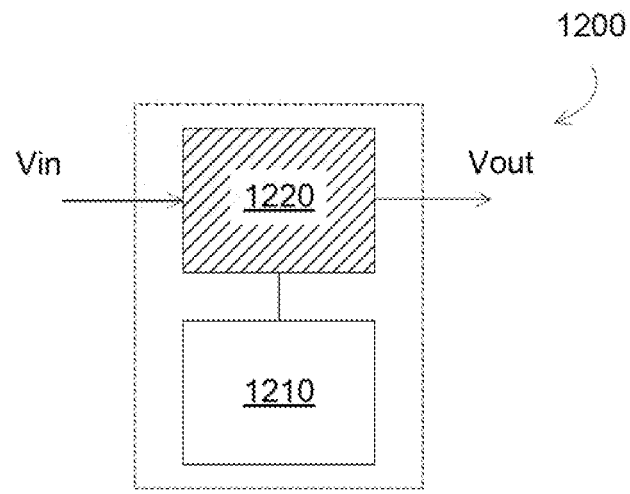
FIG. 12A
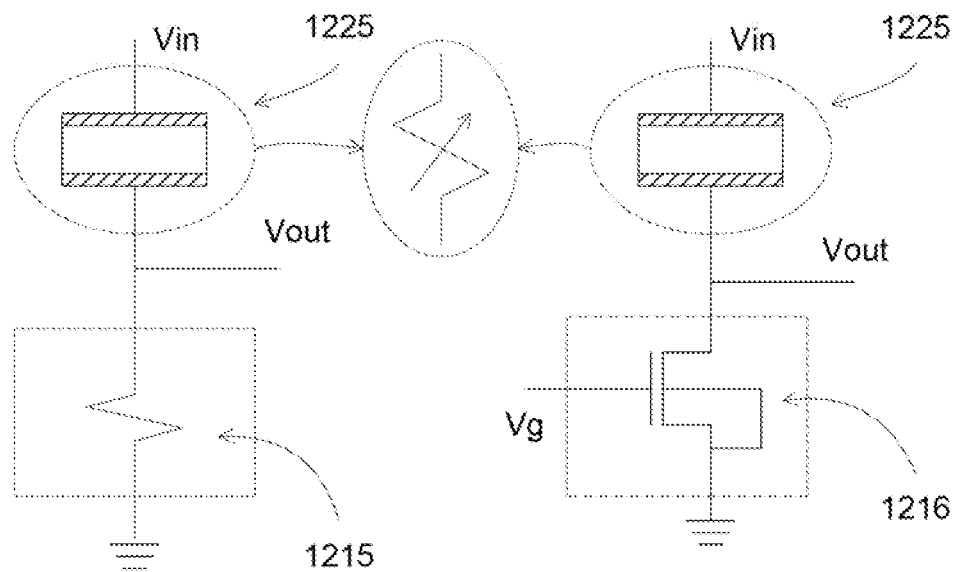
FIG. 12B     FIG. 12C

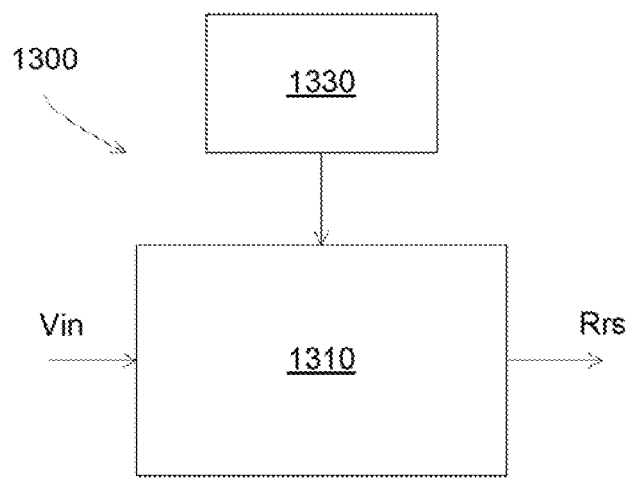
FIG. 13A
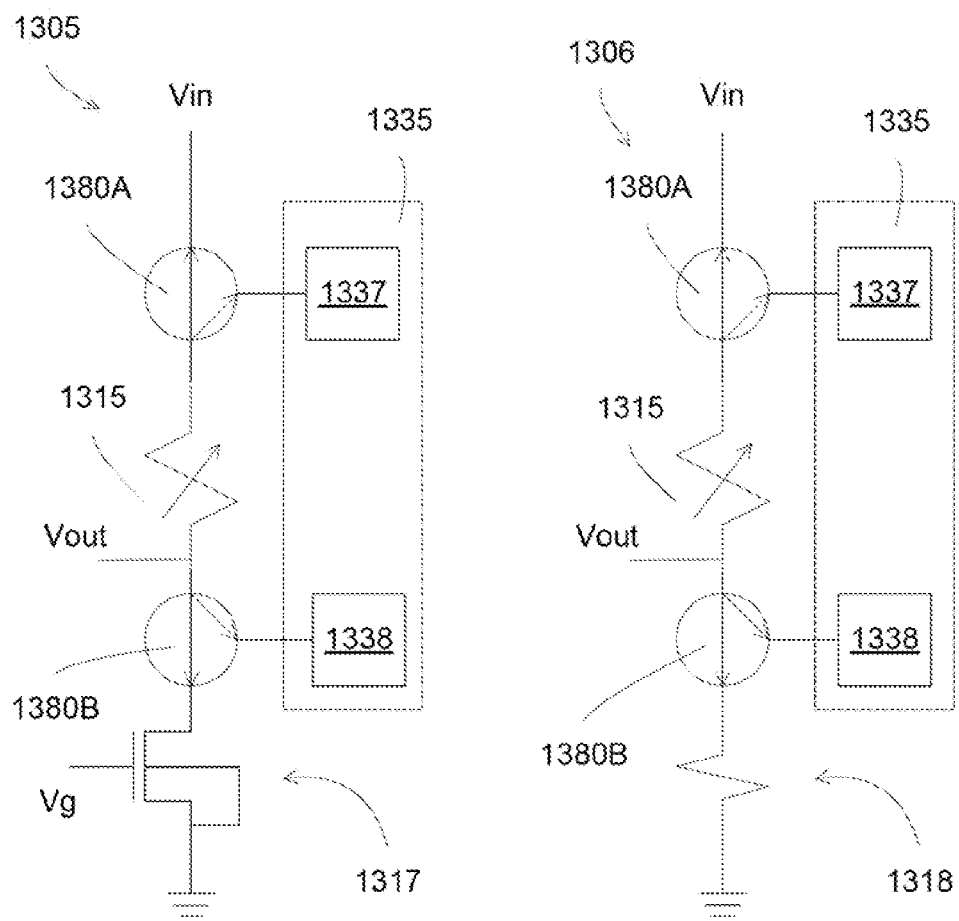
FIG. 13B   FIG. 13C

Incorporating a resistive switching circuit, and a reset circuit to form a nonvolatile comparator circuit, wherein the nonvolatile comparator circuit is operable to generate an output voltage which is a result of a comparison between the input voltage and a set voltage of the resistive switching circuit
1500

*FIG. 15A*

Providing a circuit having a resistive switching circuit, and a reset circuit
1530

Resetting the resistive switching circuit
1540

Applying an input voltage to the resistive switching circuit to generate an output voltage which is a result of a comparison between the input voltage and a set voltage of the resistive switching circuit
1550

*FIG. 15B*

Incorporating a resistive switching circuit, a reset circuit, and a threshold voltage setting circuit to form a nonvolatile comparator circuit, wherein the nonvolatile comparator circuit is operable to generate an output voltage which is a result of a comparison between the input voltage and a threshold voltage of the resistive switching circuit
1800

FIG. 18A

Providing a circuit having a resistive switching circuit, a reset circuit, and a threshold setting circuit
1830

Setting a threshold voltage to the resistive switching circuit
1840

Resetting the resistive switching circuit
1850

Applying an input voltage to the resistive switching circuit to generate an output voltage which is a result of a comparison between the input voltage and the threshold voltage of the resistive switching circuit
1860

FIG. 18B

Incorporating a resistive switching circuit, a reset circuit, and a converter circuit to form a nonvolatile comparator circuit, wherein the nonvolatile comparator circuit is operable to generate an output voltage which is a result of a comparison between the input voltage and a threshold voltage of the resistive switching circuit
2200

*FIG. 22A*

Providing a circuit having a resistive switching circuit, a reset circuit, and a converter circuit
2230

Resetting the resistive switching circuit
2240

Applying an input voltage to the resistive switching circuit to generate a resistance value which is a result of a comparison between the input voltage and the threshold voltage of the resistive switching circuit
2250

Converting the resistance value to an output voltage
2260

*FIG. 22B*

Incorporating a resistive switching circuit, a reset circuit, a converter circuit, and a threshold voltage setting circuit to form a nonvolatile comparator circuit, wherein the nonvolatile comparator circuit is operable to generate an output voltage which is a result of a comparison between the input voltage and a threshold voltage of the resistive switching circuit
2500

*FIG. 25A*

Providing a circuit having a resistive switching circuit, a reset circuit, a converter circuit, and a threshold voltage setting circuit
2530

Setting a threshold voltage to the resistive switching circuit
2540

Resetting the resistive switching circuit
2550

Applying an input voltage to the resistive switching circuit to generate a resistance value which is a result of a comparison between the input voltage and the threshold voltage of the resistive switching circuit
2560

Converting the resistance value to an output voltage
2570

*FIG. 25B*

RESISTIVE SWITCHING SCHMITT TRIGGERS AND COMPARATORS

FIELD OF THE INVENTION

This invention relates generally to resistive switching elements, and more particularly, to methods, and circuits resulted from the methods, for forming logic circuits having resistive switching elements.

BACKGROUND

A Schmitt trigger is a comparator circuit with hysteresis. The circuit is named a "trigger" because the output retains its value until the input passes upward through a threshold voltage, triggering a change. The circuit is a hysteresis circuit because it uses negative feedback to prevent switching back until the input passes through a lower threshold voltage.

Schmitt trigger devices can be used in open loop configurations to remove noise from signals used in digital circuits, for example, to eliminate signal noise caused by mechanical switch bounce. Closed loop configurations can also use Schmitt trigger devices, such as oscillators, used in function generators and switching power supplies.

Schmitt triggers can be non-inverting or inverting. In non-inverting Schmitt triggers, the output transitions to a higher value when the input increases past the threshold voltage. In inverting Schmitt triggers, the output transitions to a lower value when the input increases past the threshold voltage.

FIGS. 1A-1B illustrate a schematic behavior of a prior art non-inverting Schmitt trigger circuit. FIG. 1A shows a Schmitt trigger circuit 100, including an operational amplifier 110 and resistors R1 and R2. The positive feedback provided by these resistors creates a hysteresis controlled by the proportion between R1 and R2. Since the operational amplifier 110 has a differential input, the inverting input is grounded to make the reference point zero volts.

FIG. 1B shows a response function of the non-inverting Schmitt trigger circuit 100, which shows the output voltage Vout as a function of the input voltage Vin. When the input voltage Vin is above the high threshold T or below the low threshold −T, the output voltage has the same sign as the circuit input voltage, e.g., the output voltage is M or −M, respectively. When the circuit input voltage is between the thresholds −T and T, the output voltage Vout depends on the last state, e.g., Vout is M if previously Vin>T and Vout is −M if previously Vin<−T. For inverting Schmitt triggers, the behavior is reverse.

A comparator circuit can compare two input voltages or currents and outputs a digital signal indicating which is larger. Thus a comparator circuit can include two analog inputs, e.g., Vin and Vref, and one binary digital output Vout. If Vin is greater than Vref, Vout is positive. If Vin is smaller than Vref, Vout is zero. A comparator circuit can be used in analog-to-digital converters (ADCs) and oscillators.

FIGS. 9A-9B illustrate a schematic behavior of a prior art comparator circuit. FIG. 9A shows a comparator circuit 900, including an operational amplifier 910 and optional resistor R. The differential input of the operational amplifier 910 can be used to provide the comparison between the input voltage Vin and the reference voltage Vref.

FIG. 9B shows a response function of the comparator circuit 900, which shows the output voltage Vout as a function of the input voltage Vin. When the input voltage Vin is larger than the reference voltage Vref, the output voltage is M. When the circuit input voltage is smaller than the reference voltage Vref, the output voltage Vout is zero.

The Schmitt trigger circuit and the comparator circuit are implemented using transistor based logic components, which can have issues related to the transistor devices. Therefore, there is a need for Schmitt trigger and the comparator circuits that can meet the design criteria for advanced devices.

SUMMARY

In some embodiments, methods and circuits for forming Schmitt trigger circuits are provided. The Schmitt trigger circuits can include a resistive switching element, the resistance of which can have a nonvolatile hysteresis behavior, similar to that of the Schmitt trigger. For example, the resistance of the resistive switching element can be set and reset when the input voltage increases and decreases.

In some embodiments, the Schmitt trigger circuit can include a resistive switching circuit and a converter circuit. The resistive switching circuit can include a resistive switching element and a current control device. The current control device can be used to control the current through the resistive switching element. An input voltage can be applied to one terminal of the resistive switching element to generate a resistance hysteresis curve. An output voltage can be generated from another terminal of the resistive switching element, converting the resistance hysteresis curve into a voltage hysteresis curve.

In some embodiments, the converter circuit can be operable to convert the value of the resistive switching element to a desired output signal. For example, the converter circuit can include a current source, which can pass through the resistive switching element to generate an output voltage corresponded to the resistance of the resistive switching element.

In some embodiments, an optional toggle circuit can be included to switch control of the resistive switching element between the resistive switching circuit and the converter circuit.

In some embodiments, methods and circuits for forming comparator circuits based on set operation are provided. The comparator circuits can include a resistive switching element, which can change the resistance when the applied voltage, e.g., the input voltage, is greater in magnitude than a set threshold voltage, e.g., the voltage that can transition the resistance of the resistive switching element to a low state. For example, the resistance of the resistive switching element can change to a low value when the input voltage (the voltage applied to the resistive switching element) is greater than the reference voltage (the set threshold voltage of the resistive switching element).

In some embodiments, the comparator circuit can include a resistive switching circuit, a reset circuit, and a threshold setting circuit. The resistive switching circuit can include a resistive switching element and a current control device. The current control device can be used to control the current through the resistive switching element. An input voltage can be applied to one terminal of the resistive switching element to generate a resistance switching characteristic. An output voltage can be generated from another terminal of the resistive switching element, converting the resistance switching behavior curve into a voltage switching curve.

In some embodiments, the reset circuit can be operable to reset the value of the resistive switching element to a high resistance state. The high resistance state can serve as a base line for the resistance switching behavior, e.g., allowing the resistance of the resistive switching element to transition to a low resistance state when the applied voltage is greater than the set threshold voltage.

In some embodiments, the threshold setting circuit can be operable to set the set threshold voltage of the resistive switching element. The set threshold voltage of a resistive switching element can be a function of the properties of the resistive switching element, e.g., depending on the fabrication processes and the materials of the resistive switching element. The set threshold voltage of a resistive switching element can also be controlled by a previous reset operation. Thus the threshold setting circuit can be configured to modulate the set threshold voltage of the resistive switching element, which is essentially the reference voltage of the comparator.

In some embodiments, an optional toggle circuit can be included to switch control of the resistive switching element between the resistive switching circuit, the reset circuit, and the threshold setting circuit.

In some embodiments, methods and circuits for forming comparator circuits based on reset operation are provided. The comparator circuits can include a resistive switching element, which can change the resistance when the applied voltage, e.g., the input voltage, is greater in magnitude than a reset threshold voltage, e.g., the voltage that can transition the resistance of the resistive switching element to a high state. For example, the resistance of the resistive switching element can change to a high value when the input voltage (the voltage applied to the resistive switching element) is greater than the reference voltage (the reset threshold voltage of the resistive switching element).

In some embodiments, the comparator circuit can include a resistive switching circuit, a reset circuit, a converter circuit, and a threshold setting circuit. The resistive switching circuit can include a resistive switching element and a current control device. The current control device can be used to control the current through the resistive switching element. An input voltage can be applied to one terminal of the resistive switching element to generate a resistance switching characteristic.

In some embodiments, the converter circuit can be operable to convert the value of the resistive switching element to a desired output signal. For example, the converter circuit can include a current source, which can pass through the resistive switching element to generate an output voltage corresponded to the resistance of the resistive switching element. Thus an output voltage can be generated, converting the resistance switching behavior curve into a voltage switching curve.

In some embodiments, the reset circuit can be operable to reset the value of the resistive switching element to a low resistance state. The low resistance state can serve as a base line for the resistance switching behavior, e.g., allowing the resistance of the resistive switching element to transition to a high resistance state when the applied voltage is greater than the reset threshold voltage.

In some embodiments, the threshold setting circuit can be operable to set the reset threshold voltage of the resistive switching element. The reset threshold voltage of a resistive switching element can be a function of the properties of the resistive switching element, e.g., depending on the fabrication processes and the materials of the resistive switching element. The reset threshold voltage of a resistive switching element can also be controlled by a previous set operation. Thus the threshold setting circuit can be configured to modulate the reset threshold voltage of the resistive switching element, which is essentially the reference voltage of the comparator.

In some embodiments, an optional toggle circuit can be included to switch control of the resistive switching element between the resistive switching circuit, the reset circuit, the converter circuit, and the threshold setting circuit.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which:

FIGS. 4A-4C illustrate schematic diagrams of a Schmitt trigger circuit having a resistive switching element according to some embodiments.

FIGS. 5A-5B illustrate flowcharts for forming and operating a nonvolatile Schmitt trigger circuit having a resistive switching element according to some embodiments.

FIGS. 8A-8B illustrate flowcharts for forming and operating a nonvolatile Schmitt trigger circuit having a resistive switching element according to some embodiments.

FIGS. 12A-12C illustrate schematic diagrams of a comparator circuit having a resistive switching element according to some embodiments.

FIGS. 13A-13C illustrate schematic diagrams of a nonvolatile comparator circuit having a reset circuits according to some embodiments.

FIGS. 15A-15B illustrate flowcharts for forming and operating a nonvolatile comparator circuit having a resistive switching element according to some embodiments.

FIGS. 18A-18B illustrate flowcharts for forming and operating a nonvolatile comparator circuit having a resistive switching element according to some embodiments.

FIGS. 22A-22B illustrate flowcharts for forming and operating a nonvolatile comparator circuit having a resistive switching element according to some embodiments.

FIGS. 25A-25B illustrate flowcharts for forming and operating a nonvolatile comparator circuit having a resistive switching element according to some embodiments.

DETAILED DESCRIPTION

Figure 1A:
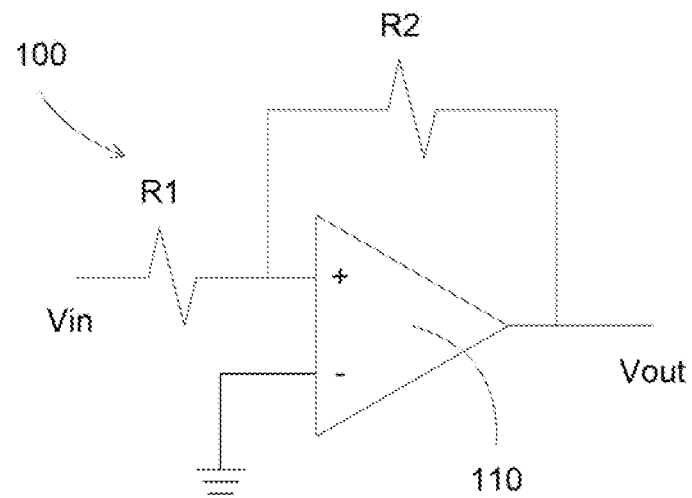
FIGS. 1A-1B illustrate a schematic behavior of a prior art non-inverting Schmitt trigger circuit.
Figure 1B:
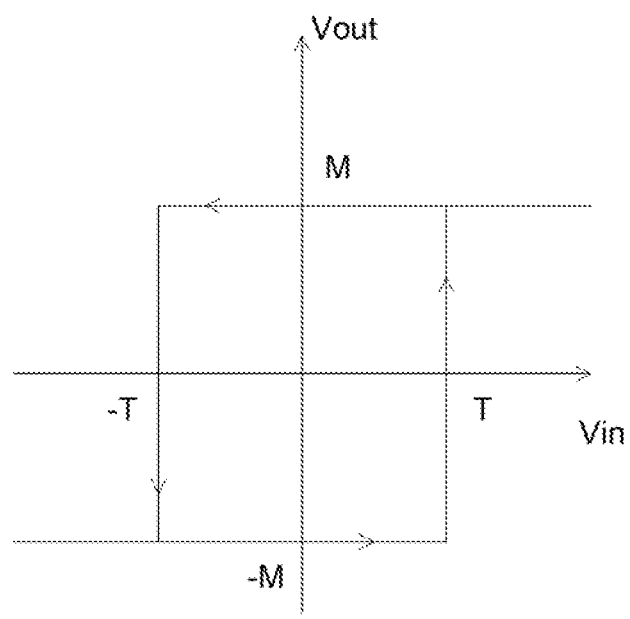

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

In some embodiments, methods to form Schmitt trigger circuits, and Schmitt trigger circuits resulted from the methods, are provided in which a resistive switching element can be operable as a hysteresis component for the signal. For example, the Schmitt trigger circuit can use the input signal to set the resistance of the resistive switching element. Since the resistive switching element switches states at set and reset voltages, the resistance-voltage curve exhibits a hysteresis curve similar to a hysteresis curve of a conventional Schmitt trigger circuit.

In some embodiments, the Schmitt trigger circuit can include a resistive switching circuit and a converter circuit. The converter circuit can be operable to convert the resistance hysteresis curve of the resistive switching circuit to a voltage (or current) hysteresis curve. For example, the converter circuit can include a current source, which can pass through the resistive switching element to generate an output voltage corresponded to the resistance of the resistive switching element. The converter circuit can be configured to generate a non-inverting or inverting Schmitt trigger circuit.

The resistive switching circuit can include a resistive switching element and an optional current control device. The current control device can include a resistor, a transistor, or other circuit elements. The current control device can be operable to control the current through the resistive switching element. For example, the current control device can be connected in series with the resistive switching element, thus by controlling the current through the current control device, the current through the resistive switching element is regulated. In some embodiments, the current control device can be omitted, for example, if the current through the resistive switching element can be limited by the internal resistance of the resistive switching element.

In a typical operation, an input voltage can be applied to the resistive switching element to generate a resistance hysteresis curve. An output voltage can be generated from the resistive switching element, for example, by the converter circuit which converts the resistance hysteresis curve into a voltage hysteresis curve.

In some embodiments, a toggle circuit can be included to switch control of the resistive switching element between the resistive switching circuit (e.g., for coupling the resistive switching element to the input voltage to set the resistance of the resistive switching element) and the converter circuit (e.g., for generating a desired output signal such as an output voltage from the resistance of the resistive switching element).

In some embodiments, the toggle operation can be cyclic, e.g., periodically switching between the resistive switching circuit and the converter circuit. For example, the toggle circuit can toggle to a first position to bring control of the resistive switching element to the input voltage. A first input voltage can be applied to the resistive switching element, setting the resistance of the resistive switching element. For example, if the input voltage is less than a set voltage, the resistive switching element remains in its high resistance state. If the input voltage is higher than the set voltage, the resistive switching element switches to its high resistance state.

The toggle circuit can toggle to a second position to bring control of the resistive switching element to the converter circuit. A voltage or current from the converter circuit can be applied to the resistive switching element, generating a current or voltage corresponded to the resistance value of the resistive switching element.

The toggle circuit can toggle back to the first position, to set the resistive switching element according to a new input voltage. The toggle operation can be repeated to generate an output voltage, which has a Schmitt trigger transfer function with respect to the input voltage.

In some embodiments, the present invention extends the use of resistive switching materials beyond the well known application in non-volatile memory devices, and applies resistive switching materials to the implementation of hybrid transistor-resistive switching logic circuits. Methods to form resistive switching Schmitt trigger circuits are provided, which can represent a fundamental building block toward the implementation of a real hybrid transistor-resistive switching electronics.

In some embodiments, the present Schmitt trigger circuit is a digital device (in contrast to an analog conventional Schmitt trigger), which generates a resistance curve or an output voltage curve in a digital fashion. In other words, the output resistance or voltage are pulsed, e.g., toggled from a cyclic operation of getting an input value to set the resistance and of generating an output voltage. The input voltage can be digital, e.g., pulsed, or analog, e.g., continuous.

The present Schmitt trigger circuit can eliminate the need for an external reference voltage, since the threshold for low-resistance-state (LRS) and high-resistance-state (HRS) of the resistive switching element are the thresholds of the trigger circuit. The present Schmitt trigger circuit can have a compact structure as compared to traditional Schmitt trigger. The present Schmitt trigger circuit can be designed to be inverting or non-inverting by changing the polarity for the resistive switching element, or by changing the polarity of the converter circuit. The present Schmitt trigger circuit can be non volatile, e.g., information is stored in the resistance changes which are non-volatile.

The non-volatile behavior of a resistive switching element can allow the implementation of non-volatile digital Schmitt trigger circuits, e.g., Schmitt trigger circuits using resistive switching elements as the hysteresis components. A description of the resistive switching element is provided below, in the context of a resistive memory device, to elucidate the behavior of the resistive switching element, and to allow an understanding of the incorporation of the resistive switching element in a sample and hold circuit.

A resistive switching random access memory (ReRAM) cell exhibiting resistive switching characteristics generally includes multiple layers formed into a stack. The structure of this stack is sometimes described as a Metal-Insulator-Metal (MIM) structure. Specifically, the stack includes two conductive layers operating as electrodes. These layers may include metals and/or other conductive materials. The stack also includes an insulator layer disposed in between the electrodes. The insulator layer exhibits resistive switching properties characterized by different resistive states of the material forming this layer. As such, this insulator layer is often referred to as a resistive switching layer. These resistive states may be used to represent one or more bits of information. The resistance switching properties of the insulator layer are believed to depend on various defects' presence and distribution inside this layer. For example, different distribution of oxygen vacancies in the layer may reflect different resistance states of the layer, and these states may be sufficiently stable for memory application.

To achieve a certain concentration of defects in the resistance switching layer, the layer has been conventionally deposited with defects already present in the layer, i.e., with preformed defects. In other words, defects are introduced into the layer during its formation. For example, tightly controlled Atomic Layer Deposition (ALD), Physical Vapor Deposition (PVD), or some other low-temperature process to remain within a Back End of Line (BEOL) thermal budget may be used to deposit the insulator layer of the stack. It may be difficult to precisely and repeatedly control formation of these defects particularly in very thin resistance switching layers (e.g., less than 100 Angstroms). For example, when ALD is used to form resistance switching layers, some unreacted precursors may leave carbon-containing residues that impact resistance characteristics of the deposition layers. Furthermore, achieving precise partial saturation repeatedly may be very difficult if possible at all. In the case of PVD, sputtering targets tend to wear out influencing the deposition rates and creating variation in resulting resistance switching layers.

Methods of forming nonvolatile memory elements can involve transferring oxygen from precursor layers (used to form or, more specifically, converted into resistance switching layers) to electrodes during annealing of the stacks. The annealing environment may include some hydrogen to control distribution of oxygen within the annealed structure.

As stated above, oxygen diffusion from the precursor layer into the electrode converts the precursor layer into a resistance switching layer. The precursor layer may include a stoichiometric oxide or near-stoichiometric oxide that cannot function as a resistance switching layer until oxygen vacancies or some other defects are formed within that layer. The metal of this oxide may be more electronegative than the metal of the electrode used to trap the oxygen diffused out of the precursor level. The electrode may have substantially no oxygen at least prior to the oxygen transfer but may form an oxide during annealing.

The stack may have a reactive electrode that receives some oxygen during annealing and an inert electrode that generally does not participate in oxygen transfer. The inert electrode may be referred to as an oxygen-resistant electrode and may be made from titanium nitride, tantalum nitride, platinum, gold, and the like. Other suitable materials for inert electrodes include various conductive oxide, such as iridium oxide and ruthenium oxide. In some embodiments, the inert electrode includes an oxide sub-layer facing the resistance switching layer. The rest of the electrode may be formed by the metal of this oxide and may be generally free of oxygen. For example, an initial structure may be fabricated from a metal and then pretreated to form an oxide layer resulting in an inert electrode. This electrode then receives a precursor layer and another reactive electrode formed over the precursor layer. During subsequent annealing, the inert electrode does not experience any significant oxygen transfer, while the reactive electrode receives oxygen from the precursor layer that is converted into the resistive switching oxide layer as it loses oxygen.

If an inert electrode with a protective oxide layer is a first formed electrode in the stack (i.e., the bottom electrode), then it can be first deposited as a metal layer followed by a short low-temperature anneal in oxygen. On the other hand, if an inert electrode is the last electrode formed in the stack (i.e., the top electrode), then its deposition can be initiated in the oxygen environment (e.g., sputtering in an oxygen-containing plasma) to form an initial oxide sub-layer followed by deposition in an inert environment to form the remaining metal (and oxygen free) portion of the electrode.

A reactive electrode can made from a material that reacts with oxygen to form a non-conductive oxide. Some examples of suitable materials include aluminum, titanium, tantalum, chromium, praseodymium, molybdenum, tungsten, and niobium.

A precursor layer may be made from materials, such as tantalum oxide ($Ta_2O_5$), niobium oxide ($Nb_2O_5$), titanium oxide ($TiO_2$), hafnium oxide ($HfO_2$), strontium titanate ($SrTiO_3$), or other suitable transition metal oxides, perovskite manganites, or rare earth oxides. The precursor layer may include a stoichiometric oxide or near-stoichiometric oxide. For example, oxygen vacancies in the precursor layer may have a concentration of less than 0.1 atomic percent prior to its annealing.

Annealing may be performed on a fully formed stack including two electrodes and precursor layer or a partially formed stack that includes only one electrode (the second electrode is formed after the annealing). Other types of layers may also be present in these stacks. As stated above, annealing performed at relatively mild conditions to achieve better control over oxygen diffusion between one or more reactive layers and precursor layer. Annealing may form a graded composition of oxygen vacancies in the precursor layer.

The resistive switching layer changes its resistive state when a certain switching voltage (e.g., a set voltage or a reset voltage) is applied to this layer as further explained below. The applied voltage causes localized heating within the layer and/or at one of both of its interfaces with other components. Without being restricted to any particular theory, it is believed that a combination of the electrical field and localized heating (both created by the applied voltage) causes formation and breakage of various conductive paths within the resistive switching layer and/or at its interfaces. These conductive paths may be established and broken by moving defects (e.g., oxygen vacancies) within the resistive switching layer and through one or more interfaces that resistive switching layer forms with adjacent layers.

The interfaces can be inert interfaces or reactive interfaces. The inert interface generally does not have any substantial defect transfer through this interface. While the defects may be present within one or both layers forming this interface, these defects are not exchanged through the inert interface when switching, reading, or other types of voltages are applied to the ReRAM cell. The reactive interface generally experiences a transfer of defects through this interface. When a resistive switching layer includes an oxygen containing material, such as metal oxides, the reactive interface is formed by an oxygen reactive material, such as titanium. The inert interface may be formed by a material that is not oxygen reactive, which may be a part of an electrode or a diffusion barrier layer. In some embodiments, the flux of defects through the reactive interface is at two or more orders of magnitude greater than the flux of defects through the inert interface. As such, the "inert" and "reactive" naming convention is relative.

The inert interface provides a control for the resistive switching layer while defects are moved in and out of the resistive switching layer through the reactive interface. For example, when a switching voltage is applied to the resistive switching layer in order to reduce its resistance, the reactive interface allows defects to flow into the layer. The defects are typically driven by the electrical potential applied to the layer and form conductive paths through the layer. The direction of this flow may be determined by the polarity of the switching voltage and/or by the electrical charge of the defects (e.g., positive charged oxygen vacancies). At the same time, the second inert interface prevents defects from escaping the layer despite the driving potential. If both interfaces are reactive and allow defects to pass through, then the resistive switching layer may gain defects at one interface and loose at another. In this situation, the layer may never be able to gain enough defects to form conductive paths.

The above scenario is applicable in a very similar manner to a resetting operation during which the resistive switching layer is brought to its high resistance state. When a switching voltage is applied to the layer in order to increase its resistance of the layer, the reactive interface allows defects to flow out of the layer. The defects may also be driven by the electrical potential applied to the layer as described above. The loss of defects may eventually break conductive paths in the layer. At the same time, the second inert interface prevents defects from entering the layer despite the driving potential. If both interfaces are reactive and allow defects to pass through during the resetting operation, then the resistive switching layer may gain defects at one interface and loose at another. In this situation, the layer may never be able to lose enough defects in order to break it conductive paths.

The ability of an interface to block defects (as in the inert interface) or to allow defects to diffuse through the interface (as in the reactive interface) depends on properties of a layer forming this interface together with the resistive switching layer. Often conductive electrodes are used to form both reactive and inert interfaces. These electrodes may be referred to as reactive and inert electrodes and materials used to form these electrodes may be referred to as reactive and inert materials. It should be noted that this terminology (i.e., reactive and inert) refers primarily to defect mobility properties of the interfaces. Some examples of inert electrode materials include doped polysilicon, platinum, ruthenium, ruthenium oxide, gold, iridium, coppers, silver, and tungsten. Examples of reactive electrode materials include titanium. Furthermore, some materials may be defined as semi-inert including tantalum nitride, tantalum silicon nitride, and tungsten silicon nitride. In the context of oxygen containing resistive switching materials, such as metal oxides, reactive materials may be also referred to as oxygen reaction materials since oxygen or oxygen vacancies are exchanged through the reactive interface. Titanium is one example of oxygen reactive materials, however other examples may be used as well.

A brief description of ReRAM cells and their switching mechanisms are provided for better understanding of various features and structures associated with methods of forming nonvolatile memory elements further described below. ReRAM is a non-volatile memory type that includes dielectric material exhibiting resistive switching characteristics. A dielectric, which is normally insulator, can be made to conduct through one or more filaments or conduction paths formed after application of a sufficiently high voltage. The conduction path formation can arise from different mechanisms, including defects, metal migration, and other mechanisms further described below. Once the one or more filaments or conduction paths are formed in the dielectric component of a memory device, these filaments or conduction paths may be reset (or broken resulting in a high resistance) or set (or re-formed resulting in a lower resistance) by applying certain voltages. Without being restricted to any particular theory, it is believed that resistive switching corresponds to migration of defects within the resistive switching layer and, in some embodiments, across one interface formed by the resistive switching voltage, when a switching voltage is applied to the layer.

Figure 2:
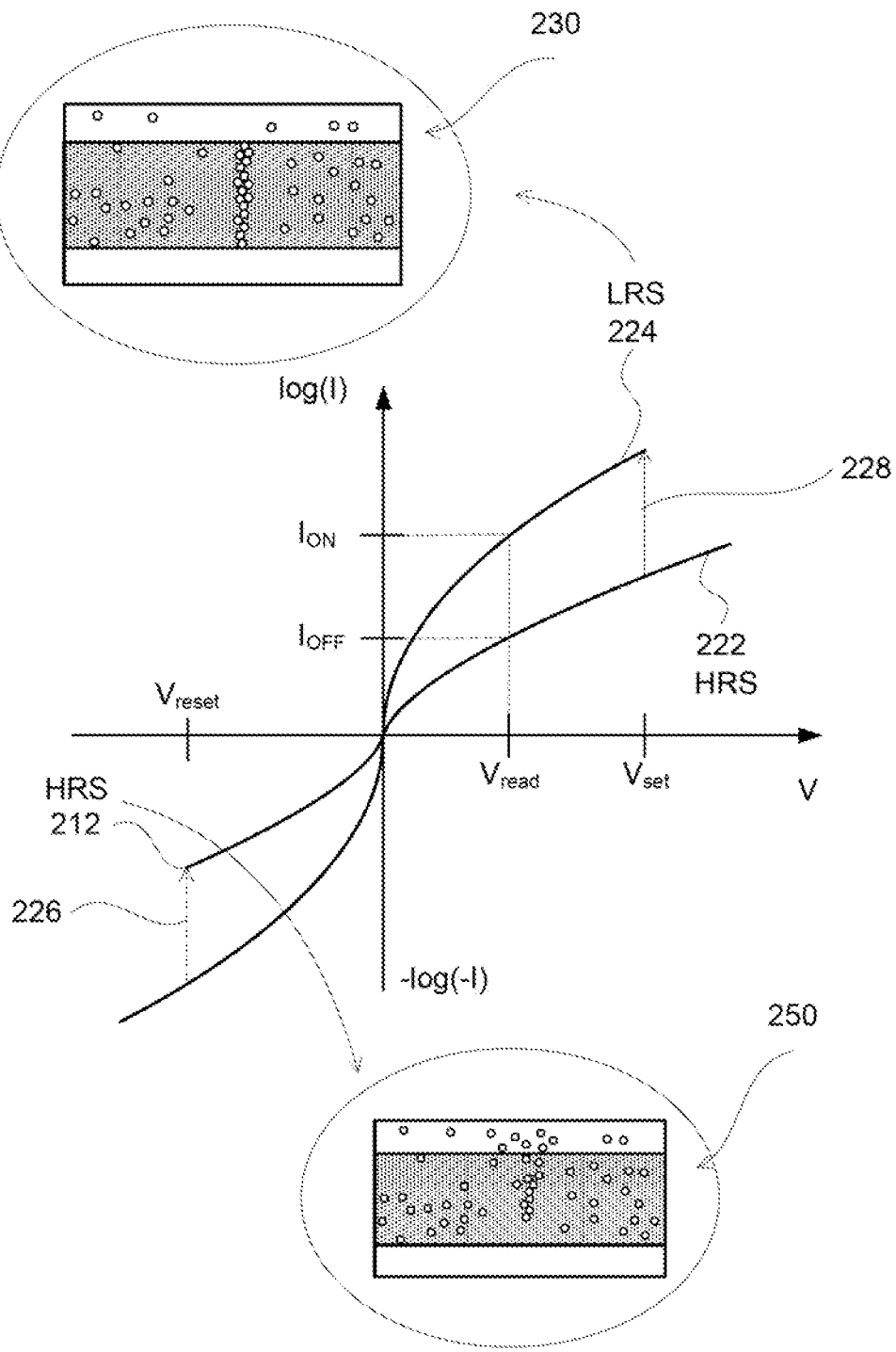
FIG. 2 illustrates a plot of a current passing through a bipolar ReRAM cell as a function of a voltage applied to the ReRAM cell according to some embodiments.

FIG. 2 illustrates a plot of a current passing through a bipolar ReRAM cell as a function of a voltage applied to the ReRAM cell according to some embodiments. A metal-insulator-metal (MIM) structure can be first fabricated with an amount of defects embedded in the insulator layer. A voltage can be applied to the MIM structure to form a resistive memory device from the MIM structure, for example, by making the insulator layer becoming a switching layer. By applying a forming voltage $V_{form}$, the randomly distributed defects can be transitioned to lower resistance configurations, for example, in the form of filaments.

The lower resistance configuration 230 can be characterized as a low resistance state (LRS) 224 for the resistive memory device, which persists even when the voltage is reduced. The LRS can represent a logic state of the memory device, such as a logic zero ("0").

At LRS, when another voltage, e.g., $V_{reset}$ is applied, the resistance can be transitioned 226 to a high resistance state (HRS) 212 which has high resistance configuration 250, which persists even when the voltage is reduced. The HRS can represent another logic state of the memory device, such as a logic one ("1"). The reset voltage $V_{reset}$ is smaller than the forming voltage $V_{form}$.

At HRS, when another voltage, e.g., $V_{set}$ is applied, the resistance can be transitioned 228 back to the low resistance state (LRS) 224, which persists even when the voltage is reduced. The set voltage $V_{set}$ is also smaller then the forming voltage $V_{form}$.

Overall, the ReRAM cell may be switched back and forth between its LRS and HRS many times. For example, when it is desired to turn "ON" the cell, e.g., to have a LRS, a set operation can be performed through the application of a set voltage $V_{set}$ to the electrodes. Applying the set voltage forms one or more conductive paths in the resistance switching layer. If it is desired to turn "OFF" the ReRAM cell, e.g., to change to HRS, a reset operation can be preformed through the application of a reset voltage $V_{reset}$ to the electrodes. Applying the reset voltage can destroy the conductive paths in the resistance switching layer.

The polarity of the reset voltage and the set voltage may be the same in unipolar memory devices (not shown), or may be different in bipolar devices. Without being restricted to any particular theory, it is believed that the resistive switching occurs due to filament formation and destruction caused by the application of electrical field.

Read operations may be performed in each of these states (between the switching operations) one or more times or not performed at all. During the read operation, the state of the ReRAM cell or, more specifically, the resistive state of its resistance of resistance switching layer can be sensed by applying a sensing voltage to its electrodes. The sensing voltage is sometimes referred to as a read voltage $V_{read}$.

In some embodiments, the set voltage $V_{set}$ is between about 100 mV and 10V or, more specifically, between about 500 mV and 5V. The length of set voltage pulses may be less than about 100 milliseconds or, more specifically, less than about 5 milliseconds and even less than about 100 nanoseconds. The read voltage $V_{read}$ may be between about 0.1 and 0.5 of the set voltage $V_{set}$. In some embodiments, the read currents ($I_{ON}$ and $I_{OFF}$) are greater than about 1 mA or, more specifically, is greater than about 5 mA to allow for a fast detection of the state by reasonably small sense amplifiers. The length of read voltage pulse may be comparable to the length of the corresponding set voltage pulse or may be shorter than the write voltage pulse. ReRAM cells should be able to cycle between LRS and HRS between at least about $10^3$ times or, more specifically, at least about $10^7$ times without failure. A data retention time should be at least about 5 years or, more specifically, at least about 10 years at a thermal stress up to 85° C. and small electrical stress, such as a constant application of the read voltage. Other considerations may include low current leakage, such as less than about 40 A/cm² measured at 0.5 V per 20 Å of oxide thickness in HRS.

In some embodiments, the resistive switching element, e.g., including the resistive memory device which has a resistive switching element dispose between two electrodes, can be used in a Schmitt trigger circuit. The nonvolatile hysteresis characteristic of the resistive switching element (or the resistive memory device) can be used to generate the hysteresis transfer function of the Schmitt trigger circuit.

Figure 3A:
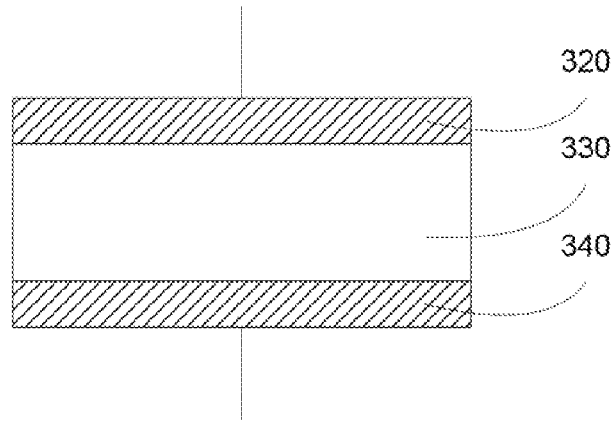
FIGS. 3A-3C illustrate hysteresis behaviors of a resistive switching element according to some embodiments.
Figure 3B:
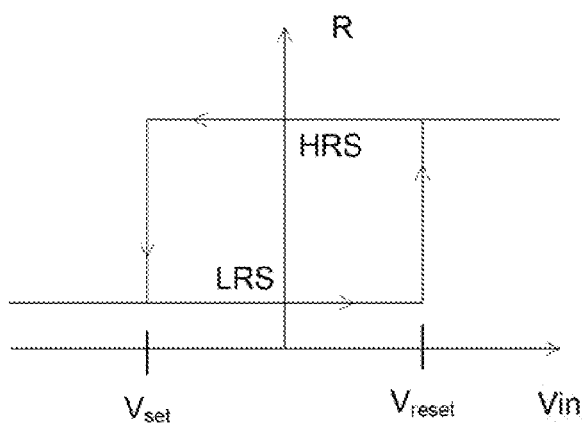
Figure 3C:
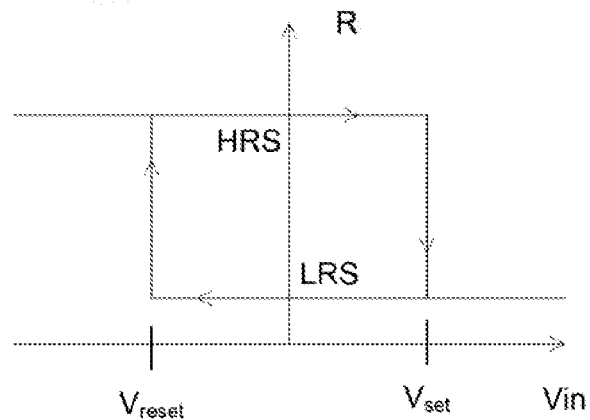

FIGS. 3A-3C illustrate hysteresis behaviors of a resistive switching element according to some embodiments. FIG. 3A shows a schematic of a resistive switching device, including a dielectric layer 330 disposed between two electrodes 320 and 430. The dielectric layer 330 can be operable as a resistive switching element, e.g., forming and dissociating conductive filaments to change the resistance. FIGS. 3B and 3C show resistance responses of the resistive switching device as a function of an input voltage applied to the electrodes 320 and 340. The resistive switching device is a bipolar resistive switching device, meaning the set voltage and the reset voltage are of opposite polarities. In FIG. 3B, the set voltage Vset is negative and the reset voltage Vreset is positive. When the input voltage Vin is greater than the reset voltage Vreset, the resistance switches from a low value (LRS) to a high value (HRS). When the input voltage Vin is greater in magnitude, e.g., more negative, than the set voltage Vset, the resistance switches from a high value (HRS) to a low value (LRS). The resistance response forms a non-inverting hysteresis curve.

In FIG. 3C, the set voltage Vset is positive and the reset voltage Vreset is negative. When the input voltage Vin is greater than the set voltage Vset, the resistance switches from a high value (HRS) to a low value (LRS). When the input voltage Vin is greater in magnitude, e.g., more negative, than the reset voltage Vreset, the resistance switches from a low value (LRS) to a high value (HRS). The resistance response forms an inverting hysteresis curve. Thus a non-inverting or an inverting response can be achieved by changing the polarities of the resistive switching device.

FIGS. 4A-4C illustrate schematic diagrams of a Schmitt trigger circuit having a resistive switching element according to some embodiments. FIG. 4A shows a schematic block of the Schmitt trigger circuit 400, which includes a resistive switching element 420 and a current control circuit 410. As shown, the Schmitt trigger circuit 400 has a hysteresis resistance-voltage transfer characteristic, e.g., having an input voltage Vin and an output resistance Rrs. In some embodiments, the current control circuit 410 can be omitted.

FIG. 4B shows an example of a Schmitt trigger circuit 400, including a resistive switching element 425 (which is disposed between two electrodes) coupled to a resistor 415. The resistive switching element 425 can have a variable resistance Rrs, which can be set by a current through the resistive switching element. The current through the resistive switching element 410 can be controlled by the resistor 415. The output voltage Vout can be taken from the resistor 415.

FIG. 4C shows an example of a Schmitt trigger circuit 400, including a resistive switching element 425 (which is disposed between two electrodes) coupled to a control transistor 416. The resistive switching element 425 can have a variable resistance Rrs, which can be set by a current through the resistive switching element. The circuit can be connected to an input voltage Vin and a gate voltage Vg for the transistor 416. The current through the resistive switching element 410 can be controlled by the gate voltage Vg of the control transistor 416. The output voltage Vout can be taken from the control transistor 416.

FIGS. 5A-5B illustrate flowcharts for forming and operating a nonvolatile Schmitt trigger circuit having a resistive switching element according to some embodiments. The resistive switching element can be an insulator or dielectric layer disposed between two electrodes. The described flowchart is a general description of techniques used to form the memory devices described above. The flowchart describes techniques for forming a sample and hold circuit generally including a resistive switching element and other support circuitries, such as a current control device. Although certain processing techniques and specifications are described, it is understood that various other techniques and modifications of the techniques described herein may also be used.

FIG. 5A shows a formation of a nonvolatile Schmitt trigger circuit having a resistive switching element. The Schmitt trigger circuit can sample an input voltage, and set the resistance of the resistive switching element corresponded to the input voltage. The response time of the resistive switching element can be short, e.g., in order of picosecond range, the sampling operation can be considered as instantaneous.

Operation 500 forms a nonvolatile Schmitt trigger circuit. The nonvolatile Schmitt trigger circuit can include a resistive switching device and a current control device, with the resistive switching device configured to accept an input voltage. The current control device can be configured to generate an output voltage.

The resistive switching element can include an insulator layer, such as a metal oxide layer of $TiO_2$, $HfO_2$, $ZnO_2$, $Al_2O_3$, strontium titanate (STO), indium gallium zinc oxide (IGZO), or $SnO_2$. The insulator layer can include a transition metal oxide. The thickness of the insulator layer can be between 3 nm and 30 nm. In some embodiments, the insulator layer can include any combinations of metal and metal oxide, chalcogenite and perovskite layers.

An optional treatment can be performed after forming the insulator layer. The treatment can include a plasma treatment or a high temperature treatment. For example, the treatment can include a rapid thermal oxidation at 300 C in oxygen ambient. The treatment can be performed in-situ after the deposition of the first electrode layer. The treatment can include an oxygen radical anneal, e.g., plasma anneal in an oxygen ambient.

In some embodiments, the insulator layer can be deposited by a PVD or ALD process. For example, an ALD process can include $O_3$ oxidant, at about 250-300 C deposition temperature, using tetrakis(ethylmethylamino)zirconium (TEMAZ), Tris(dimethylamino)cyclopentadienyl Zirconium, tetrakis(ethylmethylamino)hafnium (TEMAHf), tetrakis(dimethylamido)hafnium (TDMAHf) precursors.

The insulator can be formed between two electrodes. The electrodes can be a polysilicon layer or a metal containing layer. For example, the electrodes can be a highly doped polysilicon layer that is formed using a conventional chemical vapor deposition (CVD) or atomic layer deposition (ALD) type polysilicon deposition technique. Alternatively, the electrodes can include TiN, TaN, Ni, Pt, or Ru. Other elements can also be used, such as Ti, Al, $MoO_2$, W, poly-Si, TiSiN, TaSiN, or any combination, mixture or alloy thereof that can be formed using PVD or other processes. Other processing techniques, such as ALD, pulsed layer deposition (PLD), physical vapor deposition (PVD), CVD, evaporation, etc. can also be used to deposit the electrodes. The electrodes can have any thickness, for example between about 5 nm and about 500 nm thick.

FIG. 5B shows an operation of a nonvolatile Schmitt trigger circuit having a resistive switching element. After an input voltage is applied to the Schmitt trigger circuit, a resistance response can be provided.

Operation 530 provides a circuit having a resistive switching device and a current controlling device. The circuit can be a nonvolatile Schmitt trigger circuit. Operation 540 applies an input voltage to the circuit to achieve a Schmitt trigger function, wherein the circuit has a transfer function of a resistance-voltage curve.

In some embodiments, the nonvolatile Schmitt trigger circuit can include a converter circuit, which is operable to convert the resistance response of the resistive switching circuit, for example, to generate a voltage output Vout from the resistance output Rrs. Thus upon an input signal, such as an input voltage, an output voltage can be generated from the set resistance of the resistive switching element, which has been set to have a resistance corresponded to the input signal. The output voltage response can be non linear since a typical response of the resistive switching element is non linear as discussed above. Linear response can be achieved with an additional circuit that has an appropriate compensation response.

The converter circuit can include a voltage source (continuous or pulsed), a current source (continuous or pulsed), or any other circuitry. For example, a read circuit of a resistive memory device can be used to convert the resistance of the resistive switching element to a voltage or a current. The converter circuit can be supplied to the resistive switching element after the sampling period, e.g., after the resistive switching element has responded to the sampled signal.

Figure 6A:
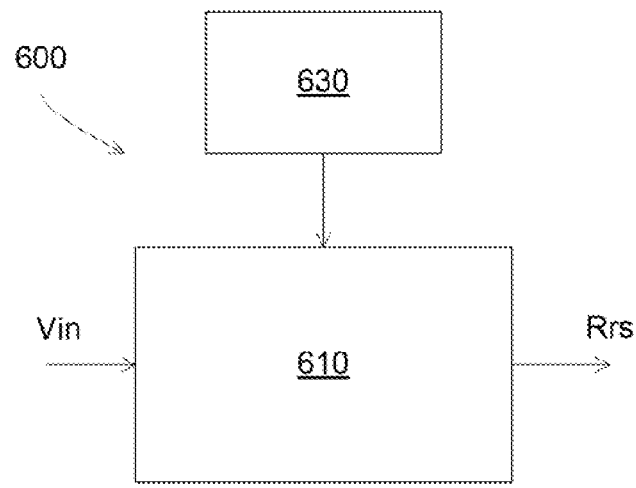
FIGS. 6A-6C illustrate schematic diagrams of a nonvolatile Schmitt trigger circuit having a converter circuits according to some embodiments.
Figure 6B:
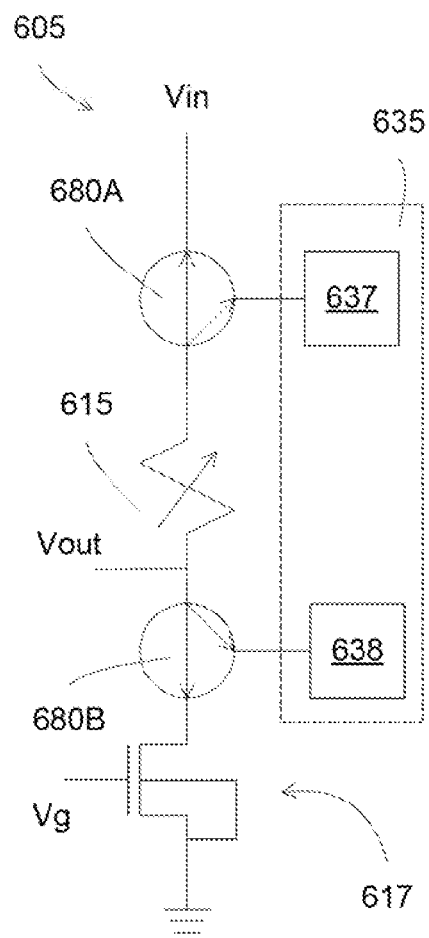
Figure 6C:
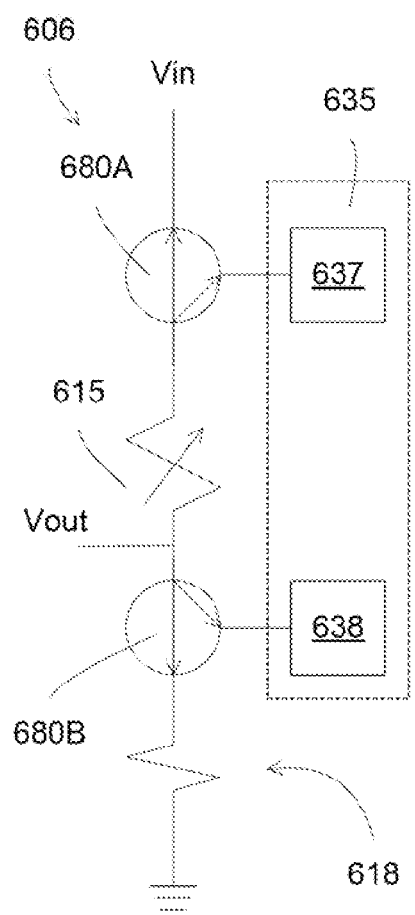

FIGS. 6A-6C illustrate schematic diagrams of a nonvolatile Schmitt trigger circuit having a converter circuits according to some embodiments. FIG. 6A shows a simplified block diagram of a circuit 600 that can provide a nonvolatile Schmitt trigger function using a resistive switching element. The circuit 600 can include a resistive switching circuit 610, e.g., a circuit having a resistive switching element. The resistive switching circuit 610 can also include a current control circuit to control the current passing through the resistive switching element. The resistive switching circuit 610 can be operable to accept an input voltage Vin, and provide a resistance response Rrs that corresponds to the input signal Vin. The resistive switching circuit 610 can be similar to a circuit having a resistance-voltage transfer function discussed above.

The circuit 600 can include a converter circuit 630, which can be operable to convert the resistive switching circuit 610, e.g., converting the resistance of the resistive switching element to a desired response, such as an output voltage or an output current. The converter circuit 630 can include a voltage or current source, which is continuous or pulsed, and which can provide a signal to the resistive switching element to generate a voltage or a current, which is corresponded to the value of the resistance of the resistive switching element. For example, if the converter circuit includes a linear current source, a voltage can be generated which is linearly proportional to the resistance. If the converter circuit includes a non linear source, a non linear signal to the resistance can be generated.

In some embodiments, upon the application of the input voltage Vin, the resistive switching circuit 610 can generate a resistance response Rrs, having a resistance value that corresponds to the input signal Vin. The converter circuit 630 can convert the resistance Rrs to a desired signal, such as an output voltage Vout.

FIG. 6B shows a simplified circuit diagram of a circuit 605 that can provide a nonvolatile Schmitt trigger function using a resistive switching element. The circuit 605 can include a resistive switching circuit, e.g., a circuit having a resistive switching element 615 and a transistor 617 acting as a current control circuit to control the current passing through the resistive switching element 615. The resistive switching circuit can be operable to accept an input voltage Vin to set the resistance of the resistive switching element 615 to be corresponded to, e.g., as a function of, the input signal Vin.

The circuit 605 can include a converter circuit 635, which can convert the resistance value of the resistive switching element 615 to a desired output signal. The converter circuit 635 can include a voltage source 637 or 638, which can provide a signal to generate a desired signal from the resistive switching element 615. A set of switches 680A and 680B can be included to toggle the resistive switching element 615 between the resistive switching circuit (including Vin and transistor 617) and the converter circuit 635. In one toggle position, the converter circuit 635 is configured to control the resistive switching element 615, e.g., for applying a voltage or current to the resistive switching element 615. In another toggle position, the resistive switching circuit is configured to control the resistive switching element 615, e.g., for setting the resistive switching element to have a resistance corresponded to the input voltage Vin.

In some embodiments, in operation, upon the application of the input voltage Vin, the resistance of the resistive switching element 615 is set to a resistance Rrs that is correlated to the voltage Vin. The converter circuit 635 then can convert the set resistance to a desired output, such as an output voltage.

FIG. 6C shows a simplified circuit diagram of a circuit 605 that can provide a nonvolatile Schmitt trigger function using a resistive switching element. The circuit 606 can include a resistive switching circuit, e.g., a circuit having a resistive switching element 615 and a resistor 618, which can act as a current control circuit to control the current passing through the resistive switching element 615. Operation of the circuit 606 can be similar to the previous circuit 605.

Figure 7A:
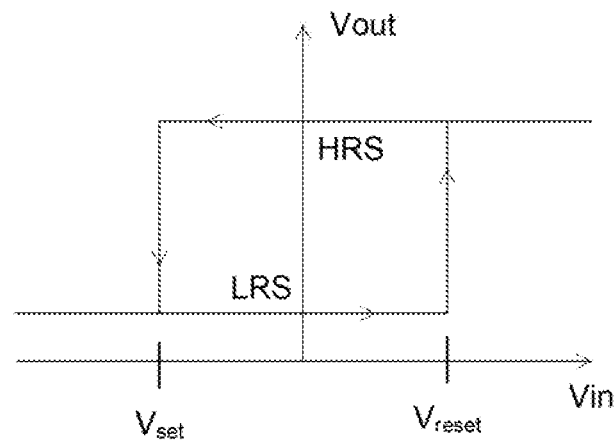
FIGS. 7A-7B illustrate responses of a nonvolatile Schmitt trigger circuit according to some embodiments.
Figure 7B:
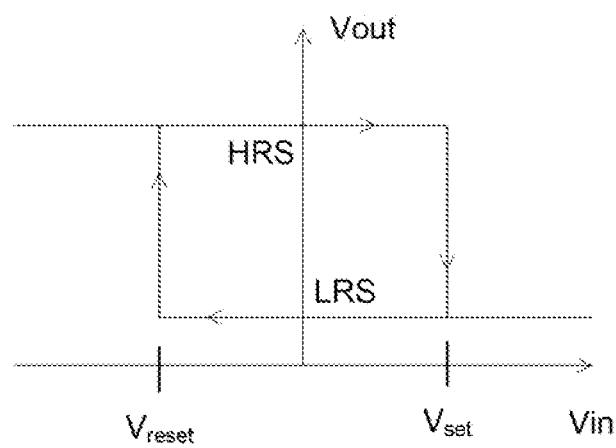
Figure 9A:
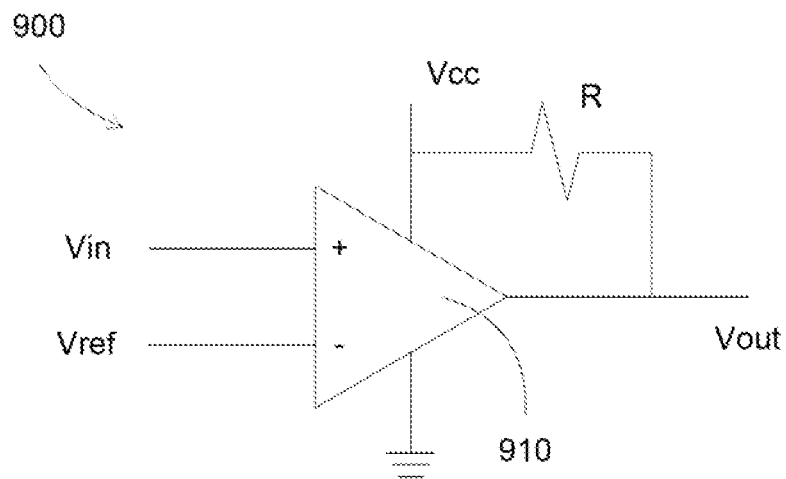
FIGS. 9A-9B illustrate a schematic behavior of a prior art comparator circuit.
Figure 9B:
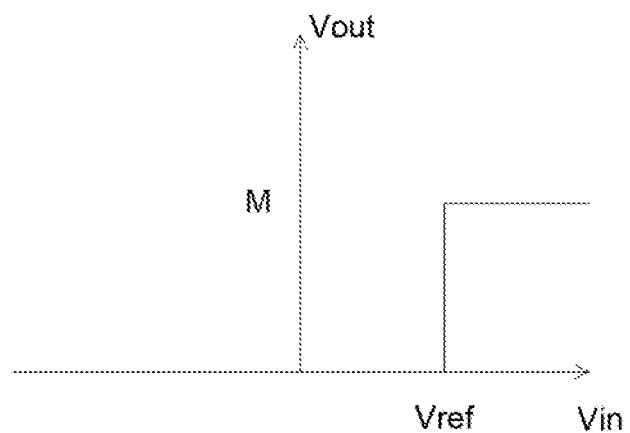

FIGS. 7A-7B illustrate responses of a nonvolatile Schmitt trigger circuit according to some embodiments. An output voltage Vout is shown as a function of an input voltage Vin. The response curve has a hysteresis form, switching between HRS and LRS values of the output voltage, at set and reset voltages of the input voltage. Non-inverting (FIG. 7A) and inverting (FIG. 7B) hysteresis responses can be generated depending on the polarities of the resistive switching device.

FIGS. 8A-8B illustrate flowcharts for forming and operating a nonvolatile Schmitt trigger circuit having a resistive switching element according to some embodiments. FIG. 8A shows a formation of a nonvolatile Schmitt trigger circuit having a resistive switching element. The Schmitt trigger circuit can be operable to accept an input voltage, and generating an output voltage having a hysteresis curve.

Operation 800 forms a nonvolatile Schmitt trigger circuit. The nonvolatile Schmitt trigger circuit can include a resistive switching circuit, and a converter circuit. The resistive switching circuit can be operable to generate a resistance Rrs in responded to an input voltage Vin. The converter circuit can be operable to convert the resistance of the resistive switching circuit to an output voltage. A toggle circuit can also be included to toggle control of the resistive switching element between the converter circuit, and the resistive switching circuit.

The nonvolatile Schmitt trigger circuit is operable as a Schmitt trigger circuit, e.g., including the function of sampling an input voltage and generating an output voltage having a Schmitt trigger response curve.

FIG. 8B shows an operation of a nonvolatile Schmitt trigger circuit having a resistive switching element. An input voltage is applied to the Schmitt trigger circuit, which can be used to set the resistance of the resistive switching element.

Operation 830 provides a circuit having a resistive switching circuit, and a converter circuit. The circuit can be a nonvolatile Schmitt trigger circuit. Operation 840 applies an input voltage to the resistive switching element to set the resistance of the resistive switching element. An optional toggling operation can be performed, to switch control of the resistive switching element to the resistive switching circuit.

Operation 850 converts the resistance of the resistive switching circuit to an output voltage, for example, by applying a current or a voltage to the resistive switching element to read the resistive switching element. An optional toggling operation can be performed, to switch control of the resistive switching element to the converter circuit.

In some embodiments, the toggle operation can be cyclic, e.g., periodically switching between the resistive switching circuit and the converter circuit. The toggling operation can generate a digital Schmitt trigger output, a pulsed output due to the toggling operation. The input voltage can be analog or digital.

In some embodiments, methods to form comparator circuits, and comparator circuits resulted from the methods, are provided in which the properties of a resistive switching element, e.g., the set or reset threshold voltage, can be used as a reference signal. For example, the comparator circuit can compare the input signal with the set or reset threshold voltage of the resistive switching element. Further, the set or reset threshold voltage can be modified by a previous reset or set operation, respectively, resulting in a comparator circuit with adjustable reference voltage.

In some embodiments, the comparator circuit can further include a reset circuit, which can be operable to set or reset the resistance state of the resistive switching element. For example, the reset circuit can be included to set the resistive switching element, e.g., putting the resistive switching element in a low resistance state (high conductivity state) before performing the comparator operation. The resistive switching element is put in a low resistance state as an initial state. The input voltage can start increase (in magnitude, either higher a positive value or lower a negative value) until reaching the reset threshold voltage, which can generate a response from the resistive switching element. Alternatively, the reset circuit can be included to reset the resistive switching element, e.g., putting the resistive switching element in a high resistance state (low conductivity state) before performing the comparator operation. The resistive switching element is put in a high resistance state as an initial state. The input voltage can start increase (in magnitude, either higher a positive value or lower a negative value) until reaching the set threshold voltage, which can generate a response from the resistive switching element.

The resistive switching circuit can include a resistive switching element and an optional current control device. The current control device can include a resistor, a transistor, or other circuit elements. The current control device can be operable to control the current through the resistive switching element. For example, the current control device can be connected in series with the resistive switching element, thus by controlling the current through the current control device, the current through the resistive switching element is regulated. In some embodiments, the current control device can be omitted, for example, if the current through the resistive switching element can be limited by the internal resistance of the resistive switching element.

In a typical operation, an input voltage can be applied to the resistive switching element. An output response can be generated from the resistive switching element, for example, when the input voltage exceeds (in magnitude) the set or reset threshold voltage of the resistive switching element.

In some embodiments, a toggle circuit can be included to switch control of the resistive switching element between the resistive switching circuit (e.g., for coupling the resistive switching element to the input voltage to set the resistance of the resistive switching element) and the reset circuit (e.g., for setting the resistive switching element to a desired initial state).

In some embodiments, the toggle operation can be performed once, e.g., first toggling to the reset circuit to set the initial value for the resistive switching element, and then toggling to the resistive switching circuit to perform the comparator function.

In some embodiments, the toggle operation can be cyclic, e.g., periodically switching between the reset circuit to set the initial value for the resistive switching element, and the resistive switching circuit to perform the comparator function. For example, a reset function can be performed after each comparator function.

In some embodiments, the present invention extends the use of resistive switching materials beyond the well known application in non-volatile memory devices, and to apply resistive switching materials to the implementation of hybrid transistor-resistive switching logic circuits. Methods to form resistive switching comparator circuits are provided, which can represent a fundamental building block toward the implementation of a real hybrid transistor-resistive switching electronics.

In some embodiments, the present comparator circuit can be a digital device (in contrast to an analog conventional comparator), which generates a comparator output voltage curve in a digital fashion. In other words, the output resistance or voltage are pulsed, e.g., toggled from a cyclic operation of getting an input value to set the resistance and of generating an output voltage. The input voltage can be digital, e.g., pulsed, or analog, e.g., continuous. The present comparator circuit can be based on the set threshold voltage or on the reset threshold voltage of the resistive switching element.

The present comparator circuit can have a compact structure as compared to traditional comparator. The present comparator circuit can eliminate the need for an external reference voltage, since the threshold for low-resistance-state (LRS)

and high-resistance-state (HRS) of the resistive switching element are the thresholds of the comparator circuit. Further, the set and reset threshold voltages can be dictated by the properties of the resistive switching element, and also controlled by the previous reset/set operation during the reset/set phase, respectively. Thus, by applying suitable electrical control, Vset_threshold and Vreset_threshold can be modulated, e.g., resulted in changing the reference voltage Vref of the comparator.

Figure 10:
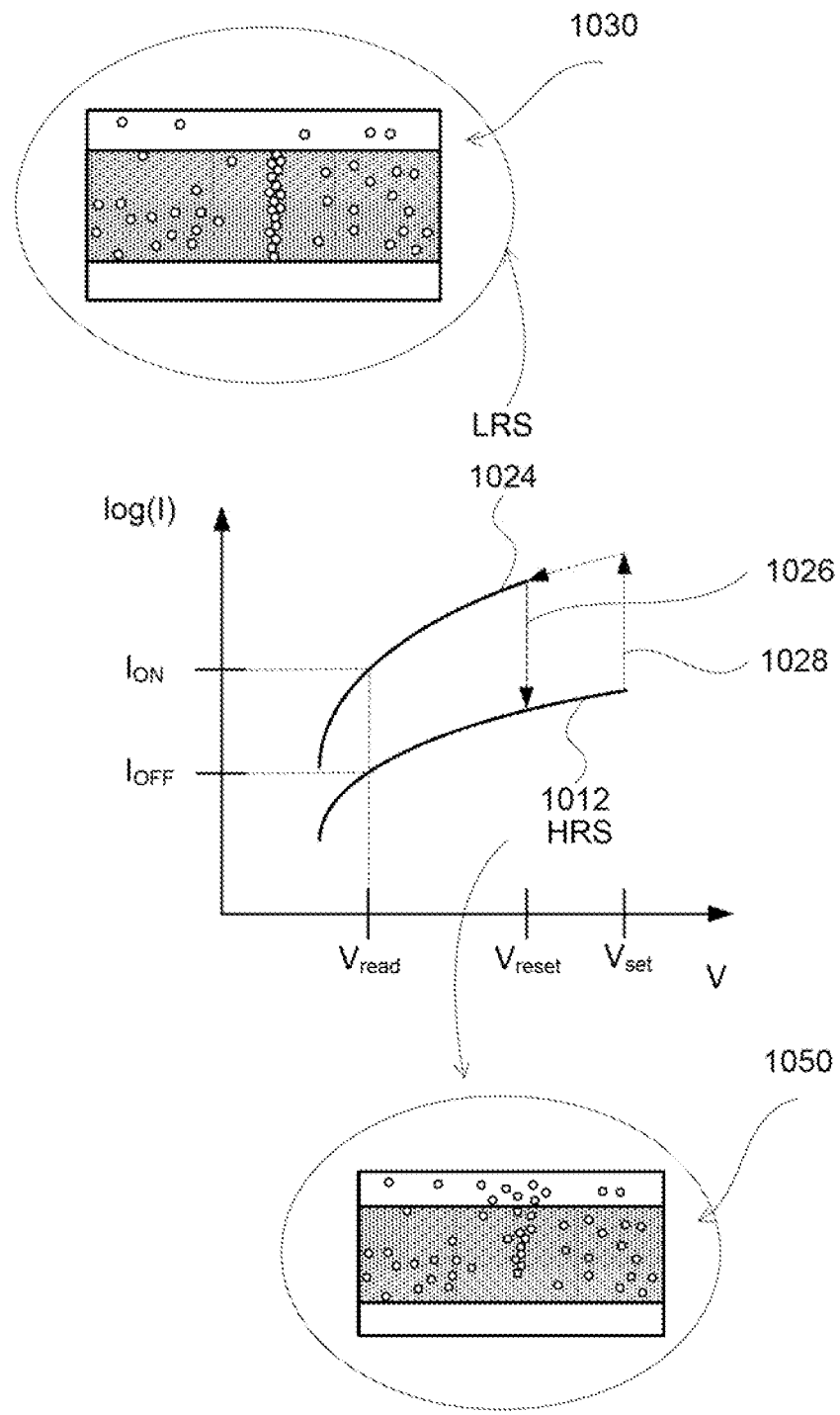
FIG. 10 illustrates a plot of a current passing through a unipolar ReRAM cell as a function of a voltage applied to the ReRAM cell according to some embodiments.

FIG. 10 illustrates a plot of a current passing through a unipolar ReRAM cell as a function of a voltage applied to the ReRAM cell according to some embodiments. The lower resistance configuration 1030 can be characterized as a low resistance state (LRS) 1024 for the resistive memory device. At LRS, when another voltage, e.g., $V_{reset}$ is applied, the resistance can be transitioned 1026 to a high resistance state (HRS) 1012 which has high resistance configuration 1050. At HRS, when another voltage, e.g., $V_{set}$ is applied, the resistance can be transitioned 1028 back to the low resistance state (LRS) 1024.

Figure 11A:
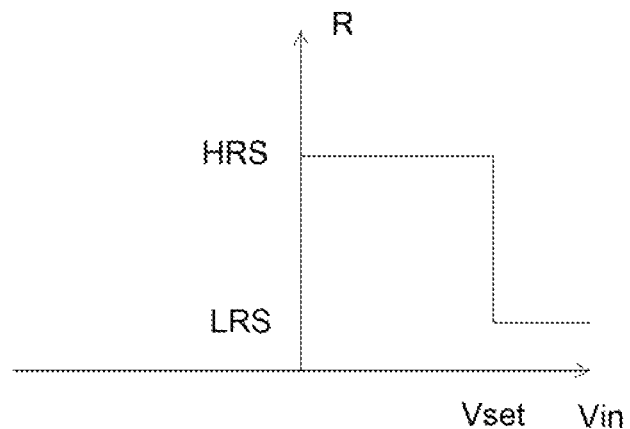
FIGS. 11A-11B illustrate comparator behaviors of a resistive switching element according to some embodiments.
Figure 11B:
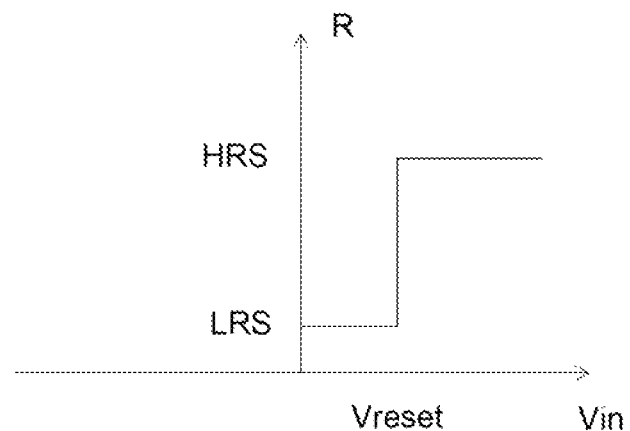

FIGS. 11A-11B illustrate comparator behaviors of a resistive switching element according to some embodiments. These figures show the resistance responses of the resistive switching device as a function of an input voltage applied to the electrodes of the resistive switching element. The resistive switching device can be a unipolar or bipolar resistive switching device. In FIG. 11A, when the input voltage Vin is greater (in magnitude) than the set voltage Vset, the resistance switches from a high value (HRS) to a low value (LRS). In FIG. 11B, when the input voltage Vin is greater (in magnitude) than the reset voltage Vreset, the resistance switches from a low value (LRS) to a high value (HRS).

FIGS. 12A-12C illustrate schematic diagrams of a comparator circuit having a resistive switching element according to some embodiments. FIG. 12A shows a schematic block of the comparator circuit 1200, which includes a resistive switching element 1220 and a current control circuit 1210. As shown, the comparator circuit 1200 has a resistance-voltage transfer characteristic, e.g., having an input voltage Vin and an output resistance Rrs. In some embodiments, the current control circuit 1210 can be omitted.

FIG. 12B shows an example of a comparator circuit 1200, including a resistive switching element 1225 (which is disposed between two electrodes) coupled to a resistor 1215. The resistive switching element 1225 can have a variable resistance Rrs, which can be set by a current through the resistive switching element. The current through the resistive switching element 1210 can be controlled by the resistor 1215. The output voltage Vout can be taken from the resistor 1215.

FIG. 12C shows an example of a comparator circuit 1200, including a resistive switching element 1225 (which is disposed between two electrodes) coupled to a control transistor 1216. The circuit can be connected to an input voltage Vin and a gate voltage Vg for the transistor 1216. The current through the resistive switching element 1210 can be controlled by the gate voltage Vg of the control transistor 1216. The output voltage Vout can be taken from the control transistor 1216.

FIGS. 13A-13C illustrate schematic diagrams of a nonvolatile comparator circuit having a reset circuits according to some embodiments. FIG. 13A shows a simplified block diagram of a circuit 1300 that can provide a nonvolatile comparator function using a resistive switching element. The circuit 1300 can include a resistive switching circuit 1310, e.g., a circuit having a resistive switching element. The resistive switching circuit 1310 can also include a current control circuit to control the current passing through the resistive switching element. The resistive switching circuit 1310 can be operable to accept an input voltage Vin, and provide a resistance response Rrs that corresponds to the input signal Vin. The resistive switching circuit 1310 can be similar to a circuit having a resistance-voltage transfer function discussed above.

The circuit 1300 can include a reset circuit 1330, which can be operable to reset the resistive switching circuit 1310, e.g., resetting the resistance of the resistive switching element in the resistive switching circuit 1310. The reset circuit 1330 can include a voltage or current source, which is continuous or pulsed, and which can provide a signal to transition the resistive switching element to a high resistance state.

In some embodiments, the reset circuit 1330 can reset the resistive switching circuit 1310, e.g., a voltage equal or greater (in magnitude) than the voltage that can set or reset the resistive switching element can be applied to the resistive switching element to put the resistive switching element to a low or high resistance value, respectively. Upon resetting the resistive switching element, the resistive switching circuit 1310 can generate a resistance response Rrs, having a resistance value that corresponds to the input signal Vin.

FIG. 13B shows a simplified circuit diagram of a circuit 1305 that can provide a nonvolatile comparator function using a resistive switching element. The circuit 1305 can include a resistive switching circuit, e.g., a circuit having a resistive switching element 1315 and a transistor 1317 acting as a current control circuit to control the current passing through the resistive switching element 1315. The resistive switching circuit can be operable to accept an input voltage Vin to set the resistance of the resistive switching element 1315 to be corresponded to, e.g., as a function of, the input signal Vin.

The circuit 1305 can include a reset circuit 1335, which can reset the resistance value of the resistive switching element 1315 to an initial value. The reset circuit 1335 can include a voltage source 1337 or 1338, which can provide a voltage or current to set or reset the resistive switching element 1315. A set of switches 1380A and 1380B can be included to toggle the resistive switching element 1315 between the resistive switching circuit (including Vin and transistor 1317) and the reset circuit 1335. In one toggle position, the reset circuit 1335 is configured to control the resistive switching element 1315, e.g., for applying a voltage or current to the resistive switching element 1315. In another toggle position, the resistive switching circuit is configured to control the resistive switching element 1315, e.g., for setting the resistive switching element to have a resistance corresponded to the input voltage Vin.

In some embodiments, in operation, after resetting the resistance of the resistive switching element, upon the application of the input voltage Vin, the resistance of the resistive switching element 1315 is set to a resistance Rrs that is correlated to the voltage Vin.

FIG. 13C shows a simplified circuit diagram of a circuit 1305 that can provide a nonvolatile comparator function using a resistive switching element. The circuit 1306 can include a resistive switching circuit, e.g., a circuit having a resistive switching element 1315 and a resistor 1318, which can act as a current control circuit to control the current passing through the resistive switching element 1315. Operation of the circuit 1306 can be similar to the previous circuit 1305.

In some embodiments, a comparator circuit is provided, which is based on the set threshold of the resistive switching element. When an input voltage is greater (in magnitude) than the set threshold voltage of the resistive switching element, a voltage transition can occur, resulting in a comparator function between the input voltage and the set threshold voltage.

Figure 14A:
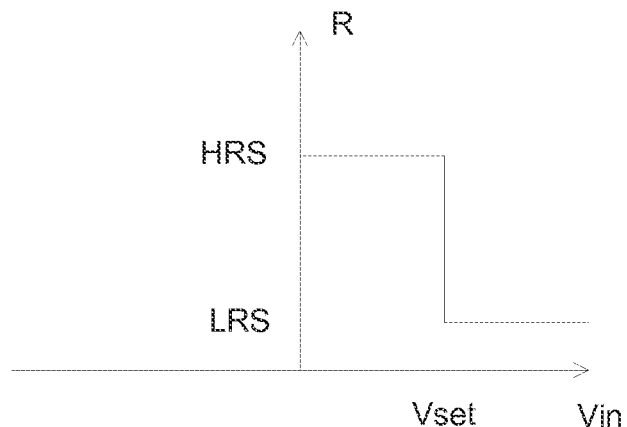
FIGS. 14A-14B illustrate responses of a nonvolatile comparator circuit according to some embodiments.
Figure 14B:
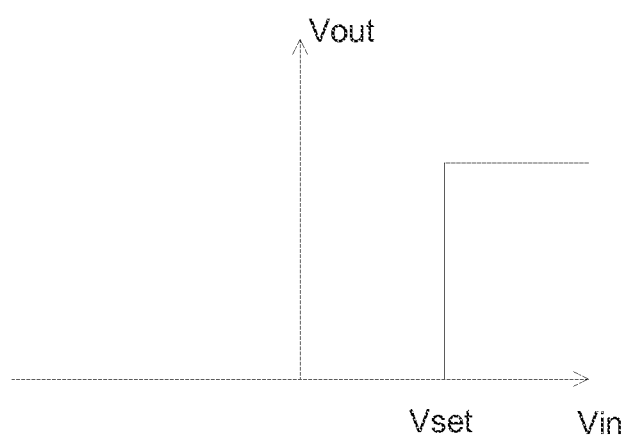

FIGS. 14A-14B illustrate responses of a nonvolatile comparator circuit according to some embodiments. An output resistance R or an output voltage Vout is shown as a function of an input voltage Vin. The response curve has a comparator form, switching between HRS and LRS values of the output voltage, at the set voltage of the input voltage.

FIGS. 15A-15B illustrate other flowcharts for forming and operating a nonvolatile comparator circuit having a resistive switching element according to some embodiments. FIG. 15A shows a formation of a nonvolatile comparator circuit having a resistive switching element. The comparator circuit can be operable to accept an input voltage, and generating an output voltage having a comparator curve.

Operation 1500 forms a nonvolatile comparator circuit. The nonvolatile comparator circuit can include a resistive switching circuit, and a reset circuit. The reset circuit can be operable to reset the resistive switching element in the resistive switching circuit to a high resistance state. The resistive switching circuit can be operable to generate an output voltage Vout in responded to an input voltage Vin. A toggle circuit can also be included to toggle control of the resistive switching element between the reset circuit and the resistive switching circuit.

The nonvolatile comparator circuit is operable as a comparator circuit, e.g., including the function of sampling an input voltage and generating an output voltage having a comparator response curve.

FIG. 15B shows an operation of a nonvolatile comparator circuit having a resistive switching element. An input voltage is applied to the comparator circuit, which can be used to generate the comparator output between the input voltage and the set threshold voltage of the resistive switching element.

Operation 1530 provides a circuit having a resistive switching circuit, and a reset circuit. The circuit can be a nonvolatile comparator circuit. Operation 1540 resets the resistive switching circuit, such as applying a reset voltage to the resistive switching element to transition the resistive switching element to a high resistance state. An optional toggling operation can be performed, to switch control of the resistive switching element to the reset circuit.

Operation 1540 applies an input voltage to the resistive switching element to generate the comparator output between the input voltage and the set threshold voltage of the resistive switching element. An optional toggling operation can be performed, to switch control of the resistive switching element to the resistive switching circuit. In some embodiments, the toggle operation can be performed once. In some embodiments, the toggle operation can be cyclic.

In some embodiments, a threshold setting circuit can be included to change the set or reset threshold of the comparator circuit. Since the set or reset threshold can be changed by a previous reset or set operation, respectively, the threshold setting circuit can be similar to a controllable reset circuit.

Figure 16A:
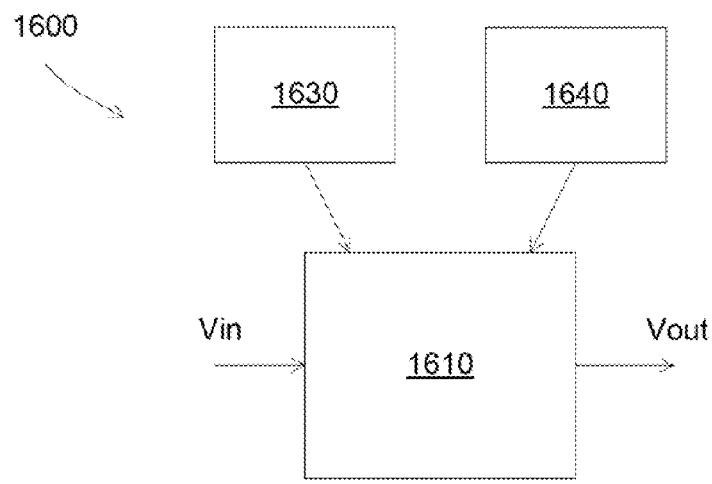
FIGS. 16A-16B illustrate schematic diagrams of a nonvolatile comparator circuit having a reset and a threshold setting circuits according to some embodiments.
Figure 16B:
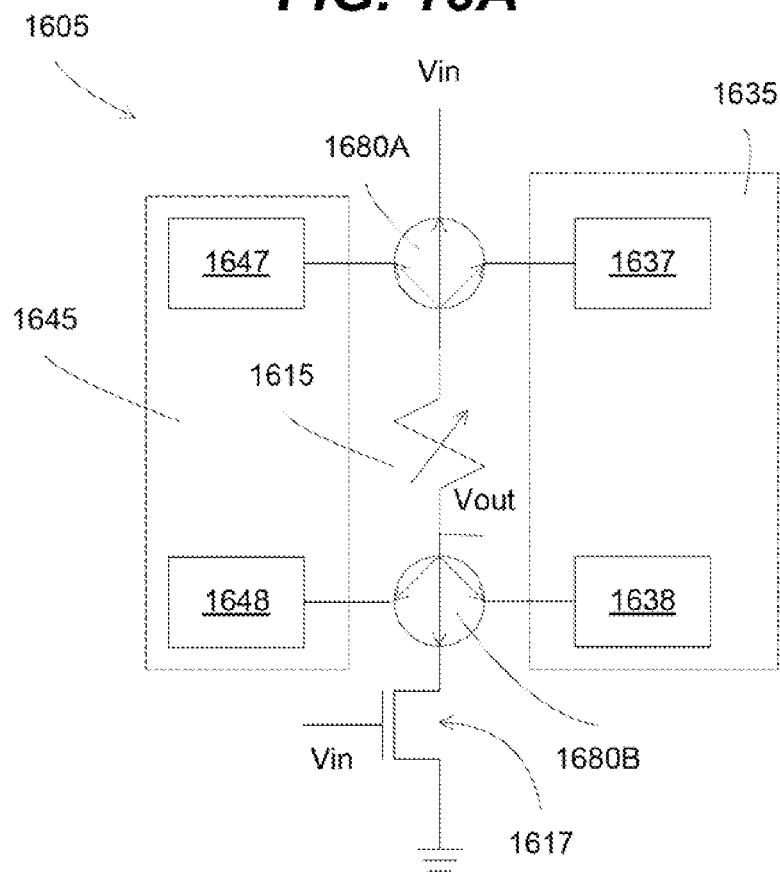

FIGS. 16A-16B illustrate schematic diagrams of a nonvolatile comparator circuit having a reset and a threshold setting circuits according to some embodiments. FIG. 16A shows a simplified block diagram of a circuit 1600 that can provide a nonvolatile comparator function using a resistive switching element. The circuit 1600 can include a resistive switching circuit 1610, e.g., a circuit having a resistive switching element. The resistive switching circuit 1610 can also include a current control circuit to control the current passing through the resistive switching element. The resistive switching circuit 1610 can be operable to accept an input voltage Vin, and provide an output response Vout that corresponds to the input signal Vin.

The circuit 1600 can include a reset circuit 1630, which can be operable to reset the resistance state of the resistive switching element. Thus a reset circuit can be included to reset the resistive switching element, e.g., putting the resistive switching element in a high resistance state (low conductivity state) before applying the input voltage.

The circuit 1600 can include a threshold setting circuit 1640, which can be operable to modify the set threshold of the resistive switching circuit 1610, e.g., changing the voltage at which the resistive switching element switches from a HRS to a LRS. The threshold setting circuit 1640 can include a voltage or current source, which is continuous or pulsed, and which can provide a signal to the resistive switching element to generate a voltage or a current, which is corresponded to the value of the resistance of the resistive switching element.

In some embodiments, after resetting the resistive switching circuit to a high resistance state, upon the application of the input voltage Vin, the resistive switching circuit 1610 can generate an output voltage response Vout, which represents a comparator signal with the set voltage of the resistive switching element.

FIG. 16B shows a simplified circuit diagram of a circuit 1605 that can provide a nonvolatile comparator function using a resistive switching element. The circuit 1605 can include a resistive switching circuit, e.g., a circuit having a resistive switching element 1615 and a transistor 1617 (or a resistor, not shown) acting as a current control circuit to control the current passing through the resistive switching element 1615. The resistive switching circuit can be operable to accept an input voltage Vin to set the resistance of the resistive switching element 1615 to be corresponded to, e.g., as a function of, the input signal Vin.

The circuit 1605 can include a reset circuit 1635, which can reset the resistive switching element 1615. The reset circuit 1635 can include a voltage source 1637 or 1638. A set of switches 1680A and 1680B can be included to toggle the resistive switching element 1615 between the resistive switching circuit (including Vin and transistor 1617) and the reset circuit 1635.

The circuit 1605 can include a threshold setting circuit 1645, which can modify the set threshold of the resistive switching element 1615. The threshold setting circuit 1645 can include a voltage source 1647 or 1648. A set of switches 1680A and 1680B can be included to toggle the resistive switching element 1615 between the resistive switching circuit (including Vin and transistor 1617) and the threshold setting circuit 1645.

In some embodiments, in operation, the set threshold of the resistive switching element is modified to a desired value. The resistive switching element is also reset to a high resistance state. Then upon the application of the input voltage Vin, an output voltage can be generated, which has the form of a comparison between the input voltage and the set threshold voltage.

Figure 17:
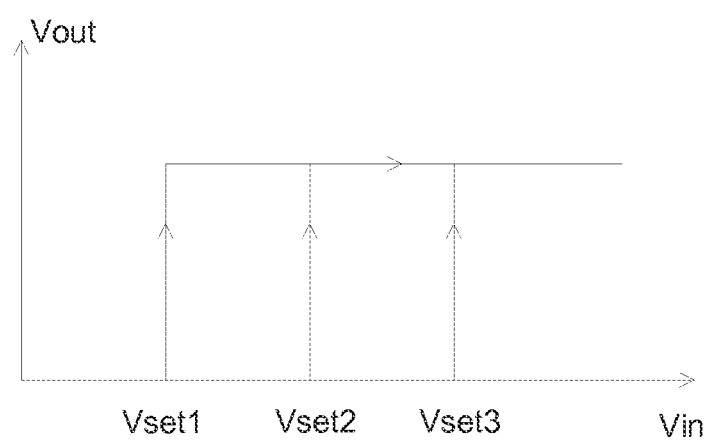
FIG. 17 illustrates responses of a nonvolatile comparator circuit according to some embodiments.

FIG. 17 illustrates responses of a nonvolatile comparator circuit according to some embodiments. An output voltage Vout is shown as a function of an input voltage Vin. The response curve has a comparator form, switching between zero and Vm, at the set threshold voltage. Different set threshold voltages Vset1, Vset2, and Vset3 are shown, representing different response curves with different set threshold operation.

FIGS. 18A-18B illustrate flowcharts for forming and operating a nonvolatile comparator circuit having a resistive switching element according to some embodiments. FIG.

18A shows a formation of a nonvolatile comparator circuit having a resistive switching element. The comparator circuit can be operable to accept an input voltage, and generating an output voltage having a comparator curve.

Operation 1800 forms a nonvolatile comparator circuit. The nonvolatile comparator circuit can include a resistive switching circuit, a reset circuit, and a set threshold circuit. The resistive switching circuit can be operable to generate a resistance Rrs in responded to an input voltage Vin. The reset circuit can be operable to reset the resistive switching element to a high resistance state. The set threshold circuit can be operable to modify the set threshold voltage of the resistive switching element. A toggle circuit can also be included to toggle control of the resistive switching element between the reset circuit, the threshold setting circuit, and the resistive switching circuit.

The nonvolatile comparator circuit is operable as a comparator circuit, e.g., including the function of sampling an input voltage and generating an output voltage having a comparator response curve.

FIG. 18B shows an operation of a nonvolatile comparator circuit having a resistive switching element. An input voltage is applied to the comparator circuit, which can be used to generate the comparator output between the input voltage and the reset threshold voltage of the resistive switching element.

Operation 1830 provides a circuit having a resistive switching circuit, a reset circuit, and a threshold setting circuit. The circuit can be a nonvolatile comparator circuit.

Operation 1840 sets, e.g., modifies, a set threshold voltage for the resistive switching element. An optional toggling operation can be performed, to switch control of the resistive switching element to the set threshold circuit before the threshold setting operation.

Operation 1850 resets the resistance of the resistive switching circuit, putting the resistive switching element to a high resistance state. An optional toggling operation can be performed, to switch control of the resistive switching element to the reset circuit.

Operation 1860 applies an input voltage to the resistive switching element to generate an output voltage, which is a result of a comparison between the input voltage and the set threshold voltage. An optional toggling operation can be performed, to switch control of the resistive switching element to the resistive switching circuit.

In some embodiments, the toggle operation can be performed once or cyclic. For example, the threshold setting operation can be performed once, and the reset operation can be cyclic, e.g., before generating the output voltages.

In some embodiments, a comparator circuit is provided, which is based on the reset threshold of the resistive switching element. When an input voltage is greater (in magnitude) than the reset threshold voltage of the resistive switching element, a voltage transition can occur, resulting in a comparator function between the input voltage and the reset threshold voltage.

Figure 19A:
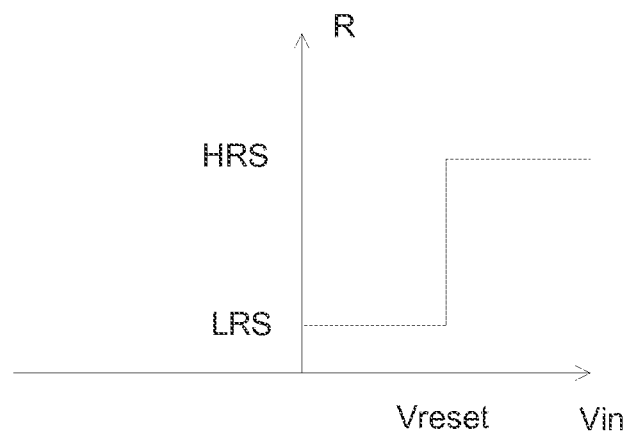
FIGS. 19A-19B illustrate responses of a nonvolatile comparator circuit according to some embodiments.
Figure 19B:
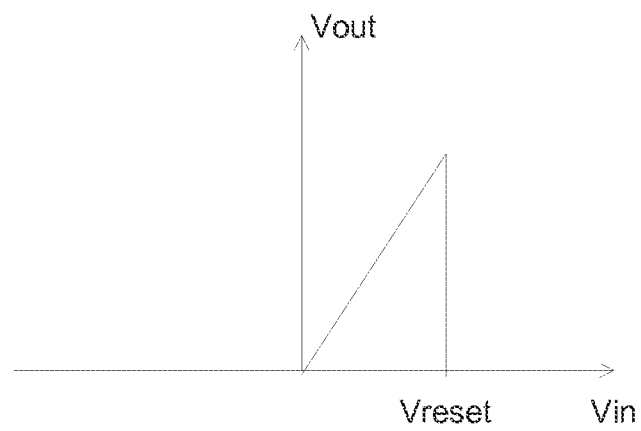

FIGS. 19A-19B illustrate responses of a nonvolatile comparator circuit according to some embodiments. An output resistance R or an output voltage Vout is shown as a function of an input voltage Vin. The response curve has a comparator form, switching from LRS and HRS values of the output voltage, at the reset voltage of the input voltage.

Figure 20A:
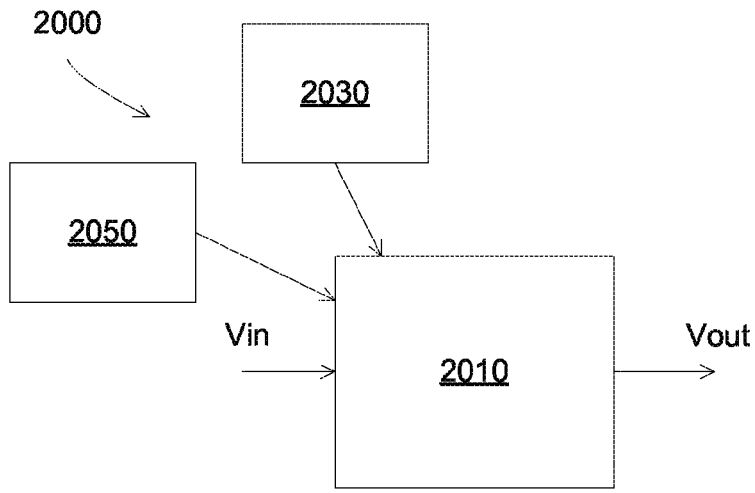
FIGS. 20A-20B illustrate schematic diagrams of a nonvolatile comparator circuit having a reset and a converter circuits according to some embodiments.
Figure 20B:
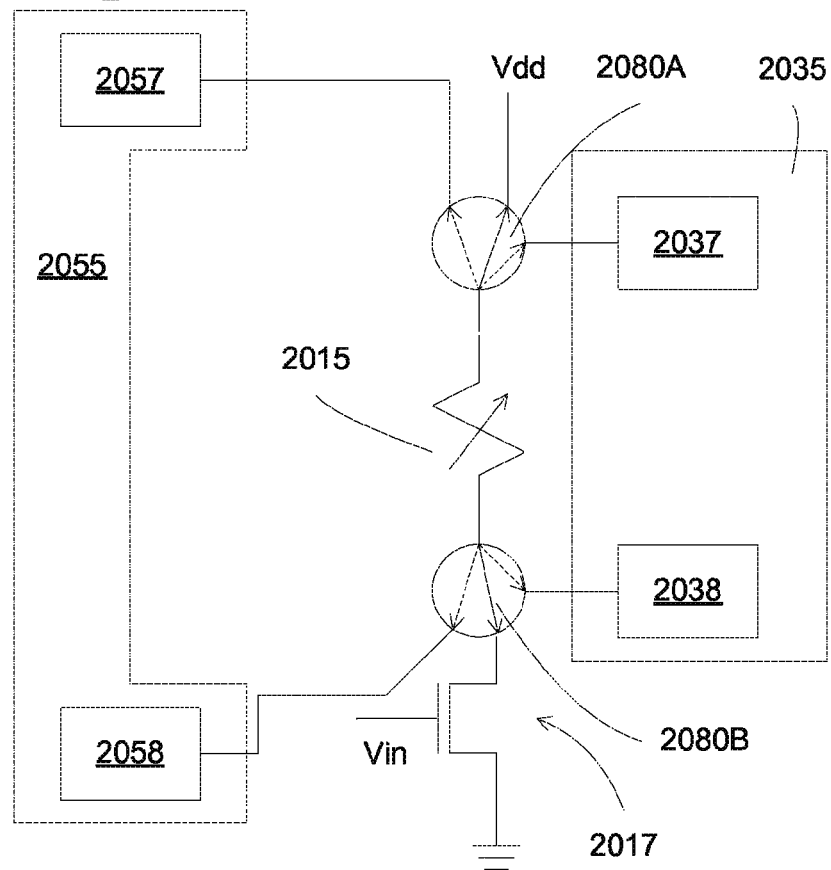

FIGS. 20A-20B illustrate schematic diagrams of a nonvolatile comparator circuit having a reset and a converter circuits according to some embodiments. FIG. 20A shows a simplified block diagram of a circuit 2000 that can provide a nonvolatile comparator function using a resistive switching element. The circuit 2000 can include a resistive switching circuit 2010, e.g., a circuit having a resistive switching element. The resistive switching circuit 2010 can also include a current control circuit to control the current passing through the resistive switching element. The resistive switching circuit 2010 can be operable to accept an input voltage Vin, and provide an output response Vout that corresponds to the input signal Vin.

The circuit 2000 can include a reset circuit 2030, which can be operable to reset the resistance state of the resistive switching element. Thus a reset circuit can be included to set the resistive switching element, e.g., putting the resistive switching element in a low resistance state before applying the input voltage.

The circuit 2000 can include a converter circuit 2050, which can be operable to convert the nonvolatile resistance value to any desired output. For example, a converter circuit having a current source can be coupled to the resistive switching element to generate an output voltage, e.g., converting the output resistance to an output voltage.

In some embodiments, after resetting the resistive switching circuit to a low resistance state, upon the application of the input voltage Vin, the resistive switching circuit 2010 can generate an output resistance response Rrs, which can be converted to an output voltage Vout, which represents a comparator signal with the reset voltage of the resistive switching element.

FIG. 20B shows a simplified circuit diagram of a circuit 2005 that can provide a nonvolatile comparator function using a resistive switching element. The circuit 2005 can include a resistive switching circuit, e.g., a circuit having a resistive switching element 2015 and a transistor 2017 (or a resistor, not shown) acting as a current control circuit to control the current passing through the resistive switching element 2015. The resistive switching circuit can be operable to accept an input voltage Vin to set the resistance of the resistive switching element 2015 to be corresponded to, e.g., as a function of, the input signal Vin.

The circuit 2005 can include a reset circuit 2035, which can reset the resistive switching element 2015. The reset circuit 2035 can include a voltage source 2037 or 2038. A set of switches 2080A and 2080B can be included to toggle the resistive switching element 2015 between the resistive switching circuit (including Vin and transistor 2017) and the reset circuit 2035.

The circuit 2005 can include a converter circuit 2055, which can convert the nonvolatile resistance value to any desired output. The converter circuit 2055 can include a voltage source 2057 or 2058. A set of switches 2080A and 2080B can be included to toggle the resistive switching element 2015 between the resistive switching circuit (including Vin and transistor 2017) and the converter circuit 2055.

In some embodiments, in operation, the reset threshold of the resistive switching element is modified to a desired value. The resistive switching element is reset to a low resistance state. Then upon the application of the input voltage Vin, an output voltage can be generated, which has the form of a comparison between the input voltage and the reset threshold voltage.

Figure 21A:
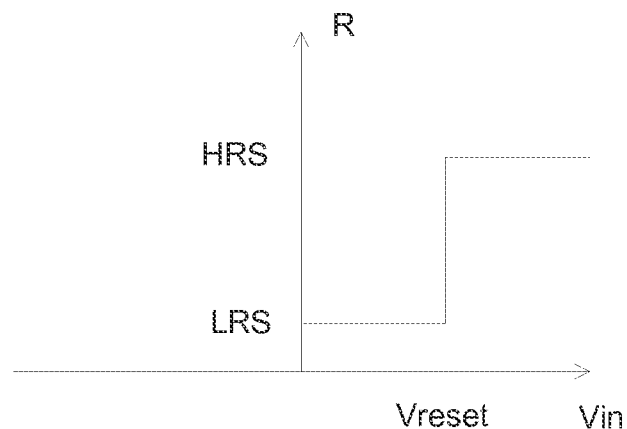
FIGS. 21A and 21B illustrate responses of a nonvolatile comparator circuit according to some embodiments.
Figure 21B:
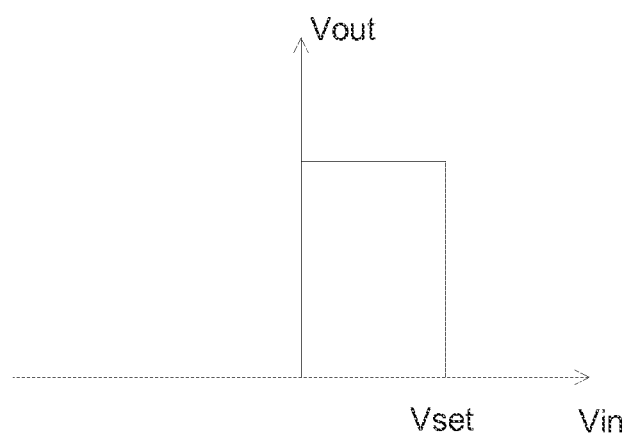

FIGS. 21A and 21B illustrate responses of a nonvolatile comparator circuit according to some embodiments. In FIG. 21A, an output resistance Rrs is shown as a function of an input voltage Vin. The response curve shows a reset transition of the resistive switching element, switching from LRS to HRS at the reset threshold voltage. In FIG. 21B, an output voltage Vout is shown as a function of an input voltage Vin. The response curve has a comparator form, switching between zero and Vm, at the reset threshold voltage. The voltage response can be a result of the converter circuit, which converts the resistance response Rrs to the voltage response Vout.

FIGS. 22A-22B illustrate flowcharts for forming and operating a nonvolatile comparator circuit having a resistive switching element according to some embodiments. FIG. 22A shows a formation of a nonvolatile comparator circuit having a resistive switching element. The comparator circuit can be operable to accept an input voltage, and generating an output voltage having a comparator curve.

Operation 2200 forms a nonvolatile comparator circuit. The nonvolatile comparator circuit can include a resistive switching circuit, a reset circuit, and a converter circuit. The reset circuit can be operable to set the resistive switching element in the resistive switching circuit to a low resistance state. The resistive switching circuit can be operable to generate a resistance output Rrs in responded to an input voltage Vin. The converter circuit can be operable to convert the resistance response to a voltage response. A toggle circuit can also be included to toggle control of the resistive switching element between the reset circuit, the converter circuit, and the resistive switching circuit.

The nonvolatile comparator circuit is operable as a comparator circuit, e.g., including the function of sampling an input voltage and generating an output voltage having a comparator response curve.

FIG. 22B shows an operation of a nonvolatile comparator circuit having a resistive switching element. An input voltage is applied to the comparator circuit, which can be used to generate the comparator output between the input voltage and the reset threshold voltage of the resistive switching element.

Operation 2230 provides a circuit having a resistive switching circuit, a reset circuit, and a converter circuit. The circuit can be a nonvolatile comparator circuit. Operation 2240 resets the resistive switching circuit, such as applying a set voltage to the resistive switching element to transition the resistive switching element to a low resistance state. An optional toggling operation can be performed, to switch control of the resistive switching element to the reset circuit.

Operation 2250 applies an input voltage to the resistive switching element to generate the comparator output between the input voltage and the set threshold voltage of the resistive switching element. An optional toggling operation can be performed, to switch control of the resistive switching element to the resistive switching circuit. In some embodiments, the toggle operation can be performed once. In some embodiments, the toggle operation can be cyclic.

Operation 2260 converts the resistance output to a voltage output. An optional toggling operation can be performed, to switch control of the resistive switching element to the converter circuit. In some embodiments, the toggle operation can be performed once. In some embodiments, the toggle operation can be cyclic.

In some embodiments, a threshold setting circuit can be included to change the set or reset threshold of the comparator circuit. Since the set or reset threshold can be changed by a previous reset or set operation, respectively, the threshold setting circuit can be similar to a controllable reset circuit.

Figure 23A:
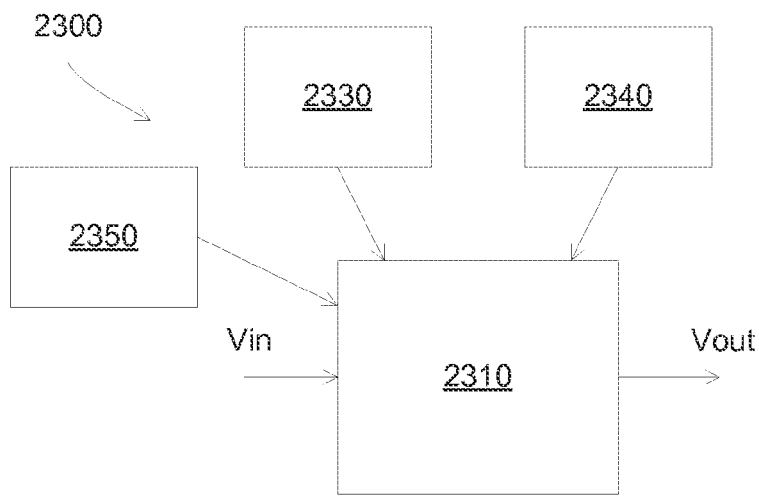
FIGS. 23A-23B illustrate schematic diagrams of a nonvolatile comparator circuit having a reset, a converter, and a threshold setting circuits according to some embodiments.
Figure 23B:
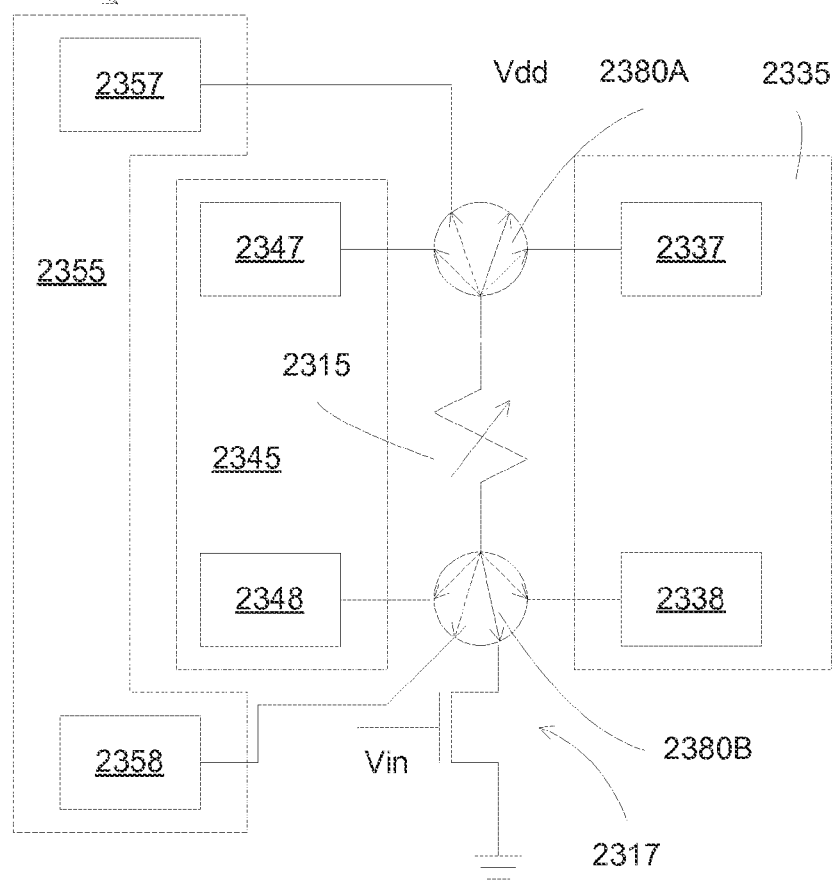

FIGS. 23A-23B illustrate schematic diagrams of a nonvolatile comparator circuit having a reset, a converter, and a threshold setting circuits according to some embodiments. FIG. 23A shows a simplified block diagram of a circuit 2300 that can provide a nonvolatile comparator function using a resistive switching element. The circuit 2300 can include a resistive switching circuit 2310, e.g., a circuit having a resistive switching element. The resistive switching circuit 2310 can also include a current control circuit to control the current passing through the resistive switching element. The resistive switching circuit 2310 can be operable to accept an input voltage Vin, and provide an output response Vout that corresponds to the input signal Vin.

The circuit 2300 can include a reset circuit 2330, which can be operable to reset the resistance state of the resistive switching element. Thus a reset circuit can be included to reset the resistive switching element, e.g., putting the resistive switching element in a high resistance state (low conductivity state) before applying the input voltage.

The circuit 2300 can include a threshold setting circuit 2340, which can be operable to modify the set threshold of the resistive switching circuit 2310, e.g., changing the voltage at which the resistive switching element switches from a HRS to a LRS. The threshold setting circuit 2340 can include a voltage or current source, which is continuous or pulsed, and which can provide a signal to the resistive switching element to generate a voltage or a current, which is corresponded to the value of the resistance of the resistive switching element.

The circuit 2300 can include a converter circuit 2350, which can convert the nonvolatile resistance value to any desired output.

In some embodiments, the set threshold voltage is modified to be a desired reference voltage value. After resetting the resistive switching circuit to a low resistance state, upon the application of the input voltage Vin, the resistive switching circuit 2310 can generate an output voltage response Vout, which represents a comparator signal with the reset voltage of the resistive switching element.

FIG. 23B shows a simplified circuit diagram of a circuit 2305 that can provide a nonvolatile comparator function using a resistive switching element. The circuit 2305 can include a resistive switching circuit, e.g., a circuit having a resistive switching element 2315 and a transistor 2317 (or a resistor, not shown) acting as a current control circuit to control the current passing through the resistive switching element 2315. The resistive switching circuit can be operable to accept an input voltage Vin to set the resistance of the resistive switching element 2315 to be corresponded to, e.g., as a function of, the input signal Vin.

The circuit 2305 can include a reset circuit 2335, which can set the resistive switching element 2315. The reset circuit 2335 can include a voltage source 2337 or 2338. A set of switches 2380A and 2380B can be included to toggle the resistive switching element 2315 between the resistive switching circuit (including Vin and transistor 2317) and the reset circuit 2335.

The circuit 2305 can include a threshold setting circuit 2345, which can modify the reset threshold of the resistive switching element 2315. The threshold setting circuit 2345 can include a voltage source 2347 or 2348. A set of switches 2380A and 2380B can be included to toggle the resistive switching element 2315 between the resistive switching circuit (including Vin and transistor 2317) and the threshold setting circuit 2345.

The circuit 2305 can include a converter circuit 2355, which can convert the nonvolatile resistance value to any desired output. The converter circuit 2355 can include a voltage source 2357 or 2358. A set of switches 2380A and 2380B can be included to toggle the resistive switching element 2315 between the resistive switching circuit (including Vin and transistor 2317) and the converter circuit 2355.

In some embodiments, in operation, the reset threshold of the resistive switching element is modified to a desired value. The resistive switching element is also set to a low resistance state. Then upon the application of the input voltage Vin, an output resistance can be generated, which can be converted to an output voltage, which has the form of a comparison between the input voltage and the reset threshold voltage.

Figure 24:
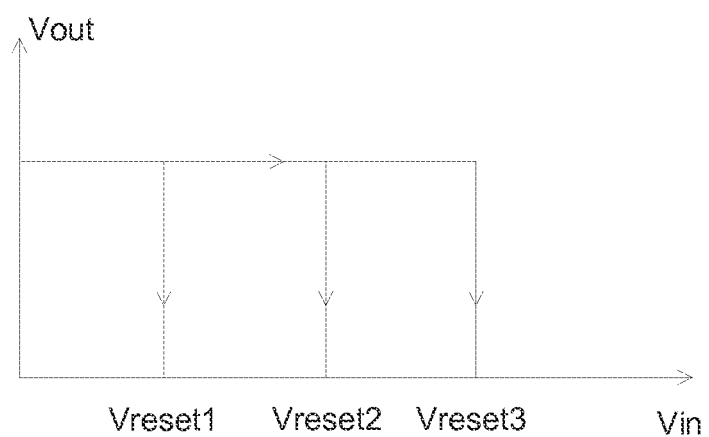
FIG. 24 illustrates responses of a nonvolatile comparator circuit according to some embodiments.

FIG. 24 illustrates responses of a nonvolatile comparator circuit according to some embodiments. An output voltage Vout is shown as a function of an input voltage Vin. The response curve has a comparator form, switching from Vm to zero, at the reset threshold voltage. Different reset threshold voltages Vreset1, Vreset2, and Vreset3 are shown, representing different response curves with different reset threshold operation.

FIGS. 25A-25B illustrate flowcharts for forming and operating a nonvolatile comparator circuit having a resistive switching element according to some embodiments. FIG. 25A shows a formation of a nonvolatile comparator circuit having a resistive switching element. The comparator circuit can be operable to accept an input voltage, and generating an output voltage having a comparator curve.

Operation 2500 forms a nonvolatile comparator circuit. The nonvolatile comparator circuit can include a resistive switching circuit, a reset circuit, a converter circuit, and a set threshold circuit. The resistive switching circuit can be operable to generate a resistance Rrs in responded to an input voltage Vin. The reset circuit can be operable to reset the resistive switching element to a high resistance state. The set threshold circuit can be operable to modify the set threshold voltage of the resistive switching element. The converter circuit can be operable to convert the resistance value to a voltage or current value. A toggle circuit can also be included to toggle control of the resistive switching element between the reset circuit, the converter circuit, the threshold setting circuit, and the resistive switching circuit.

The nonvolatile comparator circuit is operable as a comparator circuit, e.g., including the function of sampling an input voltage and generating an output voltage having a comparator response curve.

FIG. 25B shows an operation of a nonvolatile comparator circuit having a resistive switching element. An input voltage is applied to the comparator circuit, which can be used to generate the comparator output between the input voltage and the reset threshold voltage of the resistive switching element.

Operation 2530 provides a circuit having a resistive switching circuit, a reset circuit, a converter circuit, and a threshold setting circuit. The circuit can be a nonvolatile comparator circuit.

Operation 2540 sets, e.g., modifies, a reset threshold voltage for the resistive switching element. An optional toggling operation can be performed, to switch control of the resistive switching element to the set threshold circuit before the threshold setting operation.

Operation 2550 resets the resistance of the resistive switching circuit, putting the resistive switching element to a low resistance state. An optional toggling operation can be performed, to switch control of the resistive switching element to the reset circuit.

Operation 2560 applies an input voltage to the resistive switching element to generate an output resistance, which is a result of a switching of the resistive switching element. An optional toggling operation can be performed, to switch control of the resistive switching element to the resistive switching circuit.

Operation 2570 converts the output resistance to a desired value, such as an output voltage. An optional toggling operation can be performed, to switch control of the resistive switching element to the converter circuit.

In some embodiments, the toggle operation can be performed once or cyclic. For example, the threshold setting operation can be performed once, and the reset operation can be cyclic, e.g., before generating the output voltages.

Although the foregoing examples have been described in some detail for purposes of clarity of understanding, the invention is not limited to the details provided. There are many alternative ways of implementing the invention. The disclosed examples are illustrative and not restrictive.

What is claimed is:

1. A comparator circuit comprising
a resistive switching circuit,
   wherein the resistive switching circuit comprises a resistive switching element,
   wherein the resistive switching element comprises a high resistance state and a low resistance state,
   wherein the resistive switching element is configured to transition from the low resistance state to the high resistance state at a reset voltage;
a reset circuit,
   wherein the reset circuit is operable to put the resistive switching element to the low resistance state;
a converter circuit,
   wherein the converter circuit is operable to provide a voltage proportional to a resistance of the resistive switching element;
a threshold setting circuit,
   wherein the threshold setting circuit is operable to change the reset voltage.

2. A comparator circuit as in claim 1
wherein the resistive switching circuit further comprises a current control device,
wherein the current control device comprises a resistor or a transistor.

3. A comparator circuit as in claim 1
wherein the comparator circuit accepts an input voltage to a first terminal end of the resistive switching element,
wherein the comparator circuit provides an output voltage at a second terminal end of the resistive switching element.

4. A comparator circuit as in claim 1 further comprising
a toggle circuit, wherein the toggle circuit is configured to allow the reset circuit, the converter circuit, or the threshold setting circuit to be connected to the resistive switching element.

5. A comparator circuit as in claim 1
wherein the converter circuit comprises a current source providing a current through the resistive switching element.

6. A comparator circuit as in claim 1
wherein the reset circuit comprises a voltage or current source providing a current through the resistive switching element.

* * * * *